(12) United States Patent  (10) Patent No.: US 8,853,820 B2
Kastler et al.                (45) Date of Patent: Oct. 7, 2014

(54) CROSSLINKABLE DIELECTRICS AND METHODS OF PREPARATION AND USE THEREOF

(75) Inventors: Marcel Kastler, Basel (CH); Silke Annika Koehler, Basel (CH)

(73) Assignees: BASF SE, Ludwigshafen (DE); Polyera Corporation, Skokie, IL (US)

( * ) Notice: Subject to any disclaimer, the term of this patent is extended or adjusted under 35 U.S.C. 154(b) by 499 days.

(21) Appl. No.: 13/322,252

(22) PCT Filed: May 20, 2010

(86) PCT No.: PCT/EP2010/056983
§ 371 (c)(1),
(2), (4) Date: Nov. 23, 2011

(87) PCT Pub. No.: WO2010/136385
PCT Pub. Date: Dec. 2, 2010

(65) Prior Publication Data
US 2012/0068314 A1    Mar. 22, 2012

(30) Foreign Application Priority Data
May 25, 2009 (EP) ..................................... 09160980

(51) Int. Cl.
H01L 29/78 (2006.01)
H01L 51/30 (2006.01)
H01L 51/05 (2006.01)
H01L 23/498 (2006.01)
H01G 4/18 (2006.01)
H01G 4/33 (2006.01)

(52) U.S. Cl.
CPC ........ H01L 51/052 (2013.01); H01L 23/49894 (2013.01); H01G 4/18 (2013.01); H01G 4/33 (2013.01); H01L 51/0545 (2013.01); H01L 2251/308 (2013.01)
USPC ............................ 257/532; 257/410; 257/411

(58) Field of Classification Search
CPC ..................... H01L 23/49894; H01L 51/052
USPC ...................... 174/137 B; 257/410, 411, 532
See application file for complete search history.

(56) References Cited

U.S. PATENT DOCUMENTS 4,586,111 A   4/1986  Cichanowski
5,126,915 A   6/1992  Pepin et al.
(Continued)

FOREIGN PATENT DOCUMENTS

EP    0 250 631   1/1988
EP    2 014 722   1/2009
(Continued)

OTHER PUBLICATIONS

Kim, T. G., et al., "PMMA-based patternable gate insulators for organic thin-film transistors," Synthetic Metals, vol. 159, No. 7-8, pp. 749-753, (Apr. 1, 2009) XP026023385.

(Continued)

Primary Examiner — Evan Pert
(74) Attorney, Agent, or Firm — Oblon, Spivak, McClelland, Maier & Neustadt, L.L.P.

(57) ABSTRACT

The present invention relates to an electronic device comprising at least one dielectric layer, said dielectric layer comprising a crosslinked organic compound based on at least one compound which is radically crosslinkable and a method of making the electronic device.

18 Claims, 8 Drawing Sheets

(56) References Cited

U.S. PATENT DOCUMENTS

| | | | |
|---|---|---|---|
| 5,358,775 A | 10/1994 | Horn, III | |
| 5,844,362 A | 12/1998 | Tanabe et al. | |
| 6,159,611 A | 12/2000 | Lee et al. | |
| 6,274,224 B1 | 8/2001 | O'Bryan et al. | |
| 6,585,914 B2 | 7/2003 | Marks et al. | |
| 6,586,791 B1 | 7/2003 | Lee et al. | |
| 6,608,323 B2 | 8/2003 | Marks et al. | |
| 6,991,749 B2 | 1/2006 | Marks et al. | |
| 8,637,343 B2 * | 1/2014 | Mueller et al. | 438/99 |
| 2004/0222412 A1 | 11/2004 | Bai et al. | |
| 2005/0019592 A1 | 1/2005 | Bai et al. | |
| 2005/0176970 A1 | 8/2005 | Marks et al. | |
| 2006/0041096 A1 | 2/2006 | Shin et al. | |
| 2006/0186401 A1 | 8/2006 | Marks et al. | |
| 2006/0237717 A1 | 10/2006 | Bai et al. | |
| 2007/0075308 A1 | 4/2007 | Dotz et al. | |
| 2007/0282094 A1 | 12/2007 | Marks et al. | |
| 2008/0021220 A1 | 1/2008 | Marks et al. | |
| 2008/0167435 A1 | 7/2008 | Marks et al. | |
| 2008/0177073 A1 | 7/2008 | Facchetti et al. | |
| 2008/0185555 A1 | 8/2008 | Facchetti et al. | |
| 2008/0185577 A1 | 8/2008 | Facchetti et al. | |
| 2008/0249309 A1 | 10/2008 | Facchetti et al. | |
| 2008/0308793 A1 | 12/2008 | Jeong et al. | |
| 2009/0020750 A1 | 1/2009 | Doetz et al. | |
| 2009/0230388 A1 | 9/2009 | Shin et al. | |
| 2010/0009838 A1 | 1/2010 | Muraki et al. | |
| 2010/0164918 A1 | 7/2010 | Kondo | |
| 2012/0056183 A1 * | 3/2012 | Mueller et al. | 257/57 |

FOREIGN PATENT DOCUMENTS

| | | |
|---|---|---|
| JP | 2006 140400 | 6/2006 |
| JP | 2007 279728 | 10/2007 |
| WO | 03 052841 | 6/2003 |
| WO | 2007 086237 | 8/2007 |
| WO | 2008 002660 | 1/2008 |
| WO | 2008 117710 | 10/2008 |
| WO | 2009 013291 | 1/2009 |

OTHER PUBLICATIONS

Facchetti, A., et al., "Gate Dielectrics for Organic Field-Effect Transistors: New Opportunities for Organic Electronics," Advanced Materials, vol. 17, pp. 1705-1725, May 2005.

Yoon, M-H., et al., "Low-Voltage Organic Field-Effect Transistors and Inverters Enabled by Ultrathin Cross-Linked Polymers as Gate Dielectrics," Journal of the American Chemical Society, vol. 127, No. 29, pp. 10388-10395, Apr. 2005.

Allen, N. S., et al., (Edited by Fouassier, J. P., et al.), "Radiation Curing in Polymer Science and Technology," Elsevier Science Publishers Ltd., vol. 1, pp. 237-240, Jan. 1993.

Heeney, M., et al., "Stable Polythiophene Semiconductors Incorporating Thieno[2,3-b]thiophene," Journal of the American Chemical Society, vol. 127, No. 4, pp. 1078-1079, Jan. 2005.

International Search Report Issued Aug. 10, 2010 in PCT/EP10/056983 Filed May 20, 2010.

U.S. Appl. No. 13/809, 496, filed Jan. 10, 2013, Koehler, et al.

* cited by examiner

CROSSLINKABLE DIELECTRICS AND METHODS OF PREPARATION AND USE THEREOF

The present invention relates to an electronic device comprising at least one dielectric layer, said dielectric layer comprising a crosslinked organic compound based on at least one compound which is radically crosslinkable and a method of making the electronic device.

Organic polymeric materials, such as organic dielectrics, are used in a wide variety of electronic devices. Examples include electronic, optical and optoelectronic devices such as thin film transistors (TFT), specifically, organic field effective transistors (OFET), as well as sensors, capacitors, unipolar circuits, complementary circuits (e.g. inverter circuits), and the like.

The present invention especially relates to transistors, especially field effect transistors (FET), more especially organic field effect transistors (OFET). A typical FET consists of a number of layers and can be configured in various ways. For example, an FET may comprise a substrate, an insulator, a semiconductor, source and drain electrodes connected to the semiconductor and a gate electrode adjacent to the insulator. When a potential is applied on the gate electrode, charge carriers are accumulated in the semi-conductor at an interface with the insulator. As a result, a conductive channel is formed between the source and the drain electrodes and a current will flow if a potential is applied to the drain electrode.

In the past decade there has been a growing interest in developing electronic devices, especially FETs using organic materials. Organic devices offer the advantage of structural flexibility, potentially much lower manufacturing costs and the possibility of low temperature ambient manufacturing processes on large areas. To take full advantage of organic circuits there is a need for materials and processes based on efficient coating methods to form various elements on a FET.

Organic semiconductors, such as tetracene, pentacene, and sesquithiophene, are of great interest for a variety of electronic applications. One of the key benefits to using said organic semiconductors versus standard silicon-based materials is the potential to use solution deposition techniques. However, in order for this benefit to be fully realised, all components of the device should be suitable for deposition from solution, including the insulator (dielectric layer).

Furthermore, devices (e.g. transistors), made of organic polymers have yielded much lower mobiles than fully inorganic devices. It is desirable to have a reasonable charge carrier mobility within the device, usually at least 0.01 cm²/Vs, preferably greater than 0.1 cm²/Vs, more preferably greater than 1.0 cm²/Vs. However, an advantage of using organic polymer dielectric is that they are solution processable and photoprintable.

Beside a relatively high dielectric constant it is desirable for the insulators (dielectric materials) to permit the use of relatively thin films, to lower operating voltages of devices. Thus, organic polymers are desired for a variety of electronic devices (e.g., transistors, capacitors, etc.). Particularly, organic polymers are desired that combine a relatively low leakage current with a relatively high dielectric constant and that are preferably capable of being solution-deposited, e.g., by spin-coating or similar techniques.

In WO 03/052841 an organic field effect device is disclosed manufactured by a process comprising the steps of a) depositing from a solution an organic semiconductor layer; and b) depositing from the solution a layer of low conductivity insulating material forming at least a part of the gate insulator, such that the low conductivity insulating material is in contact with the organic semiconductor layer, wherein the low permittivity insulating material is of relative permittivity from 1.1 to below 3.0. It has been discovered according to WO 03/052841 that the use of insulators of low permittivity in the gate insulator layer solves the problem of interface trapping by eliminating the traps themselves and yields much better performance with organic semiconductors. The gate insulator layer comprises according to WO 03/052841 preferably an organic material, e.g. a polymer. Preferred insulators are low polarity polymers. Said polymers may be optionally crosslinked after coating by heat or radiation. Suitable polymers for crosslinking or suitable methods for crosslinking are not mentioned in WO 03/052841.

US 2004/0222412 A1 discloses organic polymers for use in electronic devices, wherein the polymer includes repeat units of the formula:

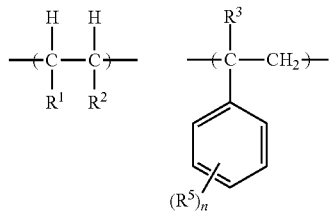

wherein:
each $R^1$ is independently H, an aryl group, Cl, Br, I, or an organic group that includes a crosslinkable group;
each $R^2$ is independently H, an aryl group or $R^4$;
each $R^3$ is independently H or methyl;
each $R^5$ is independently an alkyl group, a halogen, or $R^4$;
each $R^4$ is independently an organic group that includes at least one CN-group and has a molecular weight of about 30 to about 200 per CN-group;
and n is 0 to 3;
with the proviso that at least one repeat unit in the polymer includes a $R^4$.

The polymers mentioned before are useful in electronic devices such as organic thin film transistors. It is therefore mandatory for the polymers mentioned in US 2004/0222412 A1 that said polymers comprise an organic group that includes at least one CN-group.

WO 2008/002660 A2 discloses crosslinked polymeric dielectric materials and methods of manufacturing and the use thereof. Said crosslinked polymeric materials comprising a thermally cured product of a precursor composition, the precursor composition comprising at least one of i) a polymeric component and a crosslinker component, the crosslinker component comprising a thermally curable crosslinker having the formula:

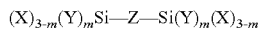
$(X)_{3-m}(Y)_m Si-Z-Si(Y)_m(X)_{3-m}$ and (ii) a polymeric crosslinker comprising a pendant group, the pendant group comprising a thermally curable crosslinking moiety having the formula:

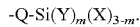
$-Q-Si(Y)_m(X)_{3-m}$.

Said crosslinked polymeric material may be used as dielectric material in a thin film transistor. According to WO 2008/002660 a very specific crosslinker or crosslinking moiety comprising at least one Si-group is employed.

A. Facchetti et al., Adv. Mater. 2005, 17, 1705 to 1725 concerns gate dielectrics for organic field-effect transistors. The article is a review and concerns recent advances in new gate dielectric materials for incorporation into organic thin-film transistors (OTFT) for organic electronics. One class of organic materials considered in the review are polymeric materials. Several different polymeric dielectric materials are mentioned, for example polyvinylphenol (PVP), polystyrene (PS), polymethylmethacrylate (PMMA), polyvinylalcohol (PVA), polyvinylchloride (PVC), polyvinylidenefluoride (PVDF), poly[α-methylstyrene] (PαMS), cyanoethylpolulan (CYPEL). The PVP polymers mentioned in Facchetti et al. may be crosslinked. A further approach for providing polymeric dielectric materials mentioned in Facchetti et al. consists of crosslinking and bonding to the gate electrode conventional polymers using α,ω-bis(trichlorosilyl)alkyl reagents and is based on the rapid, quantitative reactivity of chlorosilanes in generating robust siloxane networks. The net result is a dielectric class named crosslinked polymerblends, or CPBs, readily fabricated via spin-coating, resulting in stable, insoluble, pinhole-free films of thickness between 10 and 20 nm. A variety of CPB-structures was investigated to probe the importance of the polymer functionalisation level and crosslinking reagent on film performance. To this end, two polymers (PVP and PS) and three crosslinkers (hexachlorodisiloxane, bis(trichlorosilyl)hexane and bis(trichlorosilyl)dodecane) were investigated. The crosslinked polymer dielectric materials mentioned in Facchetti et al. are therefore very specific materials mainly based on crosslinked PVP.

M.-H. Yoon et al., J. Am. Chem. Soc. 2005, 127, 10388 to 10395 disclose low-voltage organic field effect transistors and invertors enabled by ultrathin crosslinked polymers as gate dielectrics. The realisation of new spin-coatable, ultrathin (<20 nm) crosslinked polymer blends exhibiting excellent insulating properties is reported. The crosslinked polymer blend materials according to Yoon et al. are prepared by spin-coating of a solution of an appropriate polymer and a α,ω-bis(trichlorosilyl) crosslinking reagent. The same two polymers (PVP and PS) and the same three crosslinkers (hexachlorodisiloxane, 1,6-bis(trichlorosilyl)hexane and 1,12-bis(trichlorosilyl)dodecane) as mentioned in Facchetti et al. (discussed above) have been investigated in Yoon et al. Therefore, Yoon et al. relates to very specific crosslinked polymers using an α,ω-bis(trichlorosilyl) crosslinking reagent.

T. G. Kim et al., Synthetic Metals 159 (2009) 749-753 disclose PMMA based patternable gate insulators for organic thin-film transistors. According to Kim et al. two methods were investigated. In the first method, poly(methyl methacrylate-co-2-hydroxyethyl methacrylate) functionalized with cinnamate groups was synthesized and photo-crosslinked. In the second method, a semi-interpenetrating PMMA network was prepared using a 25 wt % solution of PMMA/dipentaerythritol hexa-acrylate (DPEHA)/diphenyl(2,4,6-trimethylbenzol)phosphine oxide (TPO) by photo-crosslinking. According to Kim et al. very specific systems for preparing polymer gate insulators are disclosed.

Figure 1:
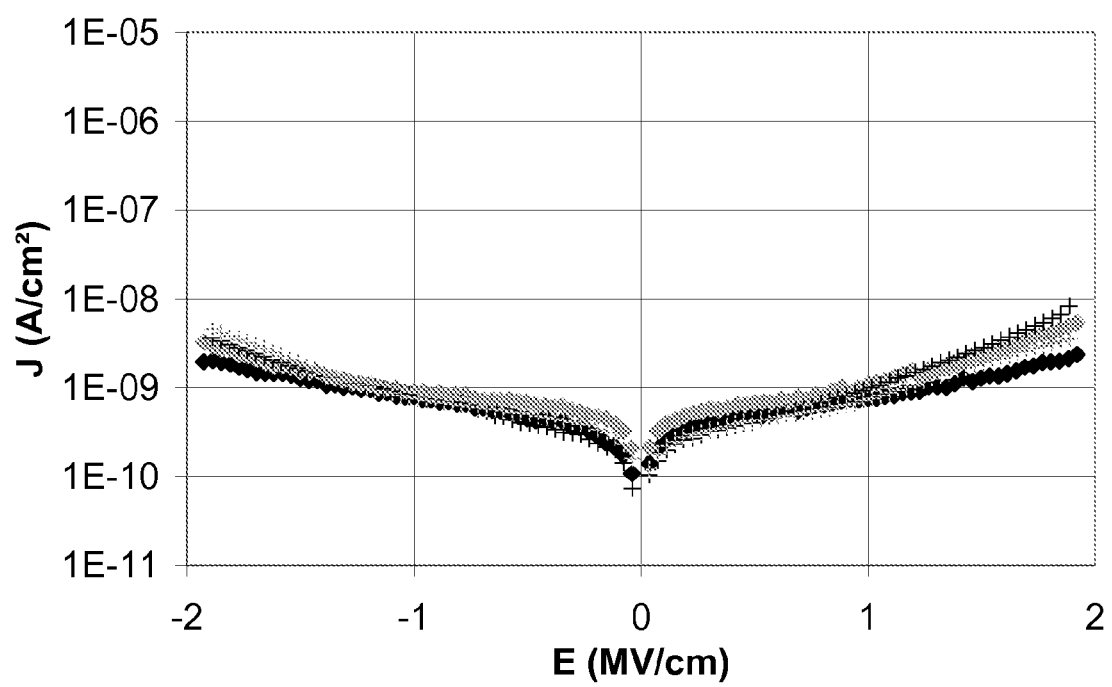
FIG. 1 shows leakage current density J versus electric field E for the dielectric films of examples I.1.a.i), I.1.a.ii), I.1.b.i) and I.1.b.ii).

It is an object of the present invention to provide electronic devices comprising dielectric layers based on alternative crosslinked materials that can be crosslinked at conditions that are specifically adjusted to the established process preparing the specific electronic device (e.g. adjustment of the wave length, energy dose, temperature, curing time, etc.). Accordingly, there is a desire in the art for adjustable crosslinkable dielectric compositions that can afford solution-processable dielectric films, which, preferably, are air- and/or moisture-stable, compatible with diverse gate and/or semiconductor materials, and especially exhibit low current leakage densities.

The object is solved by an electronic device comprising at least one dielectric layer, said dielectric layer comprising a crosslinked organic compound based on at least one compound which is radically crosslinkable, wherein the compound which is radically crosslinkable comprises at least one of the following functional groups
(i) at least one acrylate group,
(ii) at least one olefinic double bond and/or at least one triple bond in the main chain of an oligomer or polymer, and/or
(iii) at least one olefinic double bond and/or at least one triple bond in at least one side chain.

The radically crosslinkable compound of the present invention is soluble in common organic solvents but becomes significantly less soluble or insoluble in the same solvents after undergoing crosslinking.

According to the present invention a compound can be considered as soluble in a solvent when at least 1 mg of the compound can be dissolved in 1 mL of the solvent. Compounds, wherein less than 1 mg of the compound can be homogeneously dissolved in 1 mL of the solvent are considered insoluble.

The crosslinked organic compounds of the present invention usually have excellent electrical insulating properties and a low leakage current density, which enable their use as dielectrics. Preferably, the crosslinked organic compounds of the present invention usually have a leakage current density that is less than or equal to $1 \times 10^{-7}$ A/cm$^2$ at an electric field of 1 MV/cm, preferably $1 \times 10^{-8}$ A/cm$^2$ at an electric field of 1 MV/cm, more preferably $1 \times 10^{-8}$ A/cm$^2$ at an electric field of 2 MV/cm.

Leakage current density—referred to the capacitor—is according to the present invention defined as a vector of which the magnitude is the leakage current per cross-sectional area. As used herein, "leakage current" refers to uncontrolled ("parasitic") current flowing across region(s) of the device in which no current should be flowing, for example, current flowing across the gate dielectric in a dielectric-semiconductor structure. As known by those skilled in the art, the leakage current density of a dielectric material can be determined by fabricating standard metal-insulator-metal (MIM) capacitor structures with the dielectric material, then measuring the leakage current, and dividing the measure to current by the area of the metal electrodes.

The crosslinked organic compound comprised in the dielectric layer of the electronic device according to the present invention also can usually withstand very high breakdown voltages (i.e. the maximum voltage difference that can be applied across the dielectric before it breaks down and begins to conduct).

Therefore, the dielectric layer of the electronic device according to the present invention comprising the crosslinked organic compound according to the present invention exhibit a wide range of desirable properties and characteristics including, but not limited to, low leakage current densities, high breakdown voltages, low hysteresis, tuned capacitance values, uniform film thickness, solution-processability, fabricability at low temperatures and/or atmospheric pressures, air and moisture stability, and/or compatibility with diverse gate materials and/or semiconductors.

As used herein, a "polymer" or "polymeric compound" refers to a molecule (e.g., a macromolecule) including a plurality of repeating units connected by covalent chemical bonds. A polymer can be represented by the general formula:

wherein M is a repeating unit or monomer, and n is the number of M's in the polymer. For example, if n is 3, the polymer shown above is understood to be:

M-M-M.

The polymer or polymeric compound can have only one type of repeating unit as well as two or more types of different repeating units. In the former case, the polymer can be referred to as a homopolymer. In the latter case, the term "copolymer" or "copolymeric compound" can be used instead, especially when the polymer includes chemically significant different repeating units. The polymer or polymeric compound can be linear or branched. Branched polymers can include dendritic polymers, such as dendronized polymers, hyperbranched polymers, brush polymers (also called bottlebrushes), and the like. Unless specified otherwise, the assembly of the repeating units in the copolymer can be head-to-tail, head-to-head, or tail-to-tail. In addition, unless specified otherwise, the copolymer can be a random copolymer, an alternating copolymer, or a block copolymer.

As used herein, a "pendant group" refers to a moiety that is substituted on the backbone of a polymer.

As used herein, "solution-processable" refers to compounds, polymers, materials, or compositions that can be used in various solution-phase processes including spin-coating, printing (e.g., inkjet printing, screen printing, pad printing, offset printing, gravure printing, flexographic printing, lithographic printing, mass-printing and the like), spray coating, electrospray coating, drop casting, dip coating, and blade coating.

Radically Crosslinkable Organic Compound (Precursor)

The at least one dielectric layer in the electronic devices according to the present invention comprise a specific crosslinked organic compound which is based on at least one compound which is radically crosslinkable. The radically crosslinkable compound is therefore the precursor forming the crosslinked organic compound. Said precursor—the radically crosslinkable organic compound—comprises one or more double bonds in the backbone of the organic compound, pendant to the backbone or as an end group. Specifically, the radically crosslinkable organic compound (precursor) comprises at least one of the following groups
(i) at least one acrylate group,
(ii) at least one olefinic double bond and/or at least one triple bond in the main chain of an oligomer or polymer, and/or
(iii) at least one olefinic double bond and/or at least one triple bond in at least one side chain.

(i) Radically Crosslinkable Organic Compounds Comprising at Least One Acrylate Group Preferred radically crosslinkable organic compounds comprising at least one acrylate group are n-acrylates, wherein n is 3, 4 or 5, especially triacrylates, wherein preferred triacrylates having the following formulae Preferred Triacrylates:

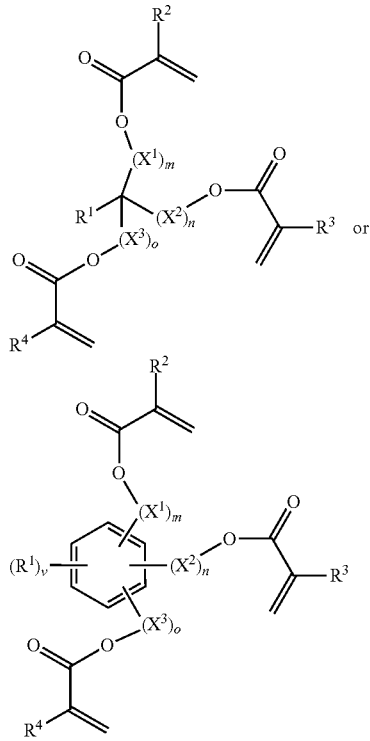

wherein
$R^1$ is H or alkyl, preferably $C_1$-$C_6$-alkyl, for example, methyl, ethyl, propyl (e.g. n-propyl and iso-propyl), butyl (e.g. n-butyl, iso-butyl, sec-butyl and tert-butyl), pentyl (e.g. n-pentyl and branched pentyl) or hexyl (e.g. n-hexyl and branched hexyl);
$R^2$, $R^3$ and $R^4$
are independently H or alkyl, preferably $C_1$-$C_6$-alkyl, more preferably $C_1$-$C_3$-alkyl, for example methyl, ethyl, propyl (e.g. n-propyl and iso-propyl);
$X^1$, $X^2$ and $X^3$
are independently $C_1$-$C_3$-alkylene, for example (—$CR^5R^6$—)$_p$, wherein $R^5$ and $R^6$ are independently H or $C_1$-$C_6$-alkyl, preferably $C_1$-$C_3$-alkyl, for example methyl, ethyl, propyl (e.g. n-propyl and iso-propyl) and p is 1, 2 or 3; preferably, $X^1$, $X^2$ and $X^3$ are methylene, ethylene or propylene, more preferably methylene; or $X^1$, $X^2$ and $X^3$ are —$CR^5R^6$—O—$CR^5R^6CR^5R^6$—, wherein $R^5$ and $R^6$ are as defined before, preferably —$CH_2$—O—$CH_2CH_2$—;

m, n and o
are independently 0, 1, 2 or 3, preferably 0 or 1;
v 0, 1, 2 or 3.

More preferred triacrylates are selected from

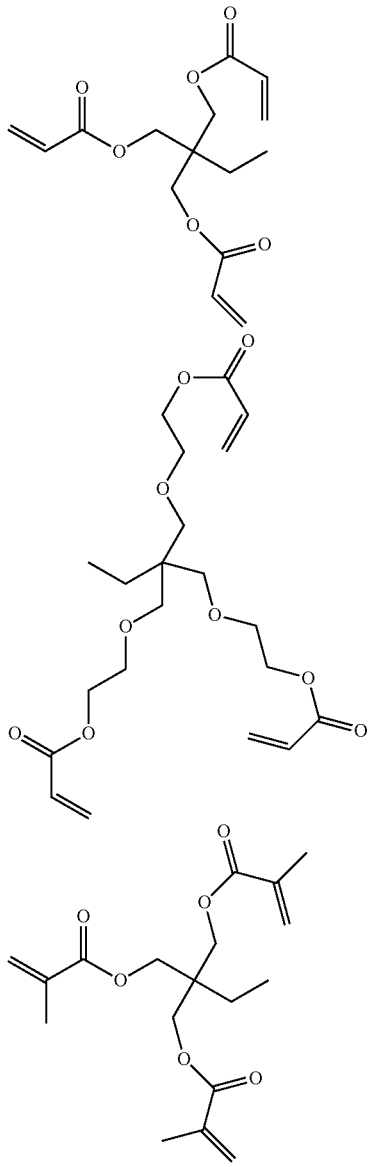

and

Further suitable radically crosslinkable organic compounds comprising at least one acrylate group are polyether acrylates, i.e. ester of acrylic acid or methacrylic acid with polyhydric alcohol, for example two basic aliphatic alcohols like ethylene glycol, propylene glycol, butylene glycol, diethylene glycol, butanediol-1,4 and hexanediol-1,6, three basic alcohols like trimethylolpropane or glycerine, four basic alcohols like pentaerythrite or six basic alcohols like sorbit or cycloaliphatic alcohols like cyclohexanols and 1,4-bis-(hydroxymethyl)cyclohexane, araliphatic alcohols like 1,3-silylene diol and phenols like 2,2-bis-(4-hydroxyphenyl-propane (bisphenol A), wherein said alcohols are alkoxylated before the esterification with acrylic acid or methacrylic acid with alkylene oxides like ethylene oxide or propylene oxide; polyester acrylates, e.g. esters of acryl acid or methacrylic acid with polyhydric alcohols, wherein the alcohols are OH-group containing polyesters; as well as acrylates in form of homopolymers or copolymers, wherein the copolymers may be random copolymers or block copolymers, whereby random copolymers are preferred. The acrylic groups may be present as end groups or in side chains. Examples are acrylates of the formulae

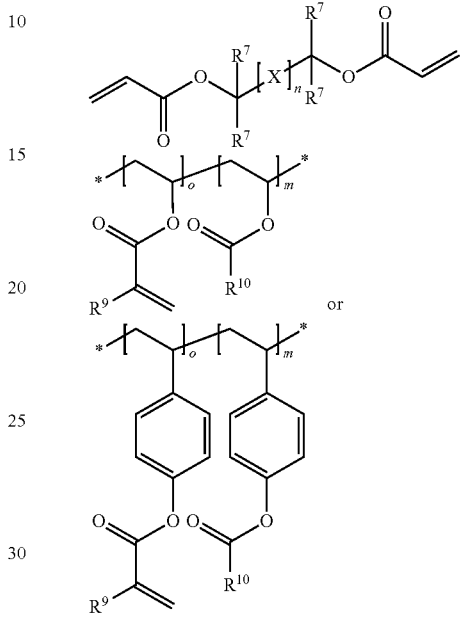

$R^9$=H, Me
$R^{10}$=$C_nH_{2n+1}$, wherein n is 1 to 6, preferably 1, 2, 3 or 4
wherein
$R^7$ is independently H, $OR^8$—, alkyl, alkenyl, alkynyl, —C(O)—$OR^8$, —C(O)—$R^8$, —OH, alkyl substituted with —OH, —C(O)—$OR^8$—, —C(O)—$R^8$—, alkyl, wherein the alkyl chain is interrupted by one or more, preferably one or two, oxygen atoms, aryl, heteroaryl, cycloalkyl and heterocycloalkyl;
X is $CR^8_2$, O, $NR^8$, SiO or $SiR^8_2$;
$R^8$ is H, alkyl, aryl, heteroaryl, cycloalkyl or heterocycloalkyl, vinyl, alkenyl, alkynyl, cycloalkenyl, cycloalkynyl,
n is 1 to 20, preferably 1 to 10, more preferably 1 to 3,
o+m is 1 to 500, preferably 10 to 300, more preferably 100 to 200.

In one aspect, the present teachings provide materials that include one or more crosslinkable functionalities and additives or functionalities that can initiate a radical crosslinking when exposed to light of a specific wavelength and energy dose and/or a certain temperature. The crosslinking group can form or be a portion of a pendant group covalently attached to or form a portion of the backbone of the materials. This means, that the radically cross linkable compounds comprising at least one acrylate group as mentioned before may also comprise at the backbone, pendant or at the end groups a residue which is capable of initiating cross linking by using radiation. The residue which is capable of initiating cross linking by using radiation is for example based on at least one initiator comprising copopymerizable groups, wherein said initiator is copolymerized together with the monomers for preparing the radically crosslinkable organic compounds comprising at least one acrylate group. Suitable initiators are for example: Initiators comprising vinyl groups or acrylate groups, e.g.

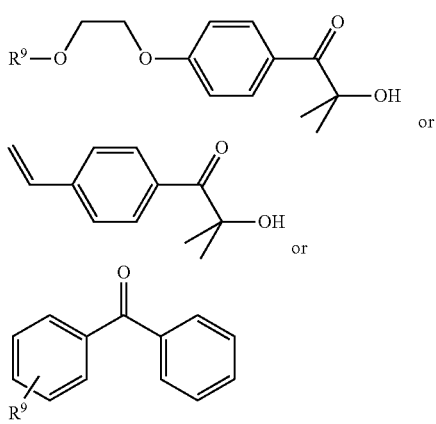

wherein
R⁹ is independently

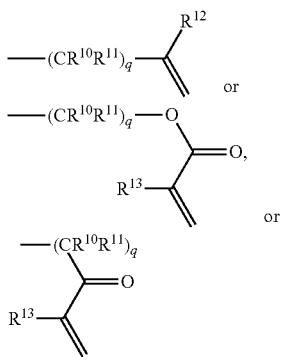

wherein $R^{10}$ and $R^{11}$
are independently H or $C_1$-$C_6$-alkyl, preferably $C_1$-$C_3$-alkyl, for example methyl, ethyl, propyl (e.g. n-propyl and iso-propyl), more preferably H; and q is 0, 1, 2 or 3; and $R^{12}$ and $R^{13}$
are independently H or alkyl, preferably $C_1$-$C_6$-alkyl, more preferably $C_1$-$C_3$-alkyl, for example methyl, ethyl, propyl (e.g. n-propyl and iso-propyl), more preferably H.

Most preferably, the at least one compound comprising at least one acrylate group is selected from triacrylates, especially from triacrylates having the formula

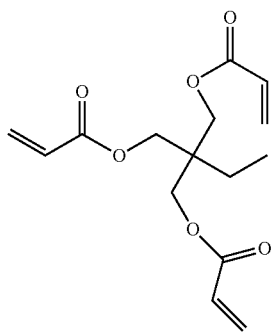

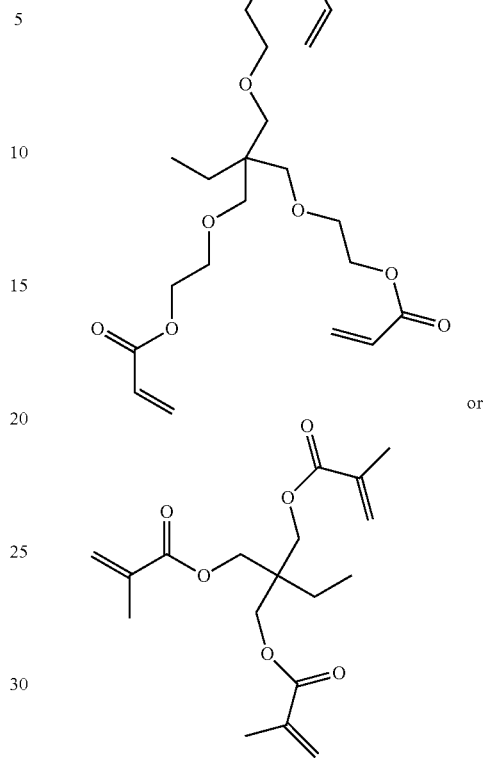

(ii) A Radically Crosslinkable Organic Compound Comprising at Least One Olefinic Double Bond and/or at Least One Triple Bond in the Main Chain of the Oligomer or Polymer Suitable radically crosslinkable organic compounds comprising at least one olefinic double bond and/or at least one triple bond in the main chain of an oligomer or polymer are known by a person skilled in the art. Preferably, the radically crosslinkable organic compound comprising at least one olefinic double bond and/or at least one triple bond in the main chain of an oligomer or polymer is a butadiene-styrene copolymer. The butadiene-styrene copolymer may be a block copolymer or a random copolymer. The block copolymer may for example be a di or triblock copolymer, preferably a triblock copolymer having the following sequence: -[styrene-butadiene-styrene]- or -[butadiene-styrene-butadiene]-, wherein "butadiene" is a unit derived from butadiene and "styrene is a unit derived from styrene. In a further embodiment of the present invention the copolymer is a random copolymer. The amount of butadiene derived units in said butadiene-styrene copolymer is preferably of from 10 to 40 wt.-%, more preferably 15 to 35 wt.-%. The amount of styrene derived units in said butadiene-styrene copolymer is preferably of from 60 to 90 wt.-%, more preferably 65 to 85 wt.-%, wherein the total amount of butadiene and styrene derived units in said copolymer is 100 wt.-%. In a preferred embodiment the copolymer comprises 20 to 30 wt.-% of butadiene derived units and 70 to 80 wt.-% of styrene derived units, wherein the sum of butadiene units and styrene derived units is 100 wt.-%. The butadiene derived units may be present in the copolymer in form of 1,2-butadiene units and/or 1,4-butadiene units. The styrene-butadiene copolymer may optionally partially hydrogenated. However, there should be enough double bonds in the partially hydrogenated copolymer for crosslinking. The weight average molecular weight of the butadiene-styrene copolymers is usually of from 10,000 to 500,000, preferably 30,000 to 400,000, more preferably 50,000 to 300,000 (determined by SEC with polystyrene standard).

Suitable butadiene-styrene copolymers are for example butadiene-styrene copolymers of the following formulae:

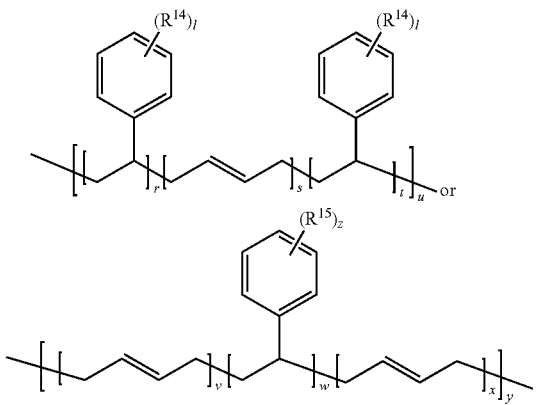

wherein r, s, t, v, w and x
  are independently 0 to 1000, preferably 0 or 10 to 900, more preferably 0 or 100 to 800, u and y
  are independently 1 to 1000, preferably 1 to 900, more preferably 1 to 800, $R^{14}$ and $R^{15}$
  are independently $C_1$-$C_6$-alkyl, preferably $C_1$-$C_3$-alkyl, for example methyl, ethyl, propyl (e.g. n-propyl and iso-propyl), alkoxy ($OR^{16}$), carboxy ($OC(O)R^{17}$ where $R^{16}$ and $R^{17}$
  are independently $C_1$-$C_6$-alkyl, preferably $C_1$-$C_3$-alkyl, for example methyl, ethyl, propyl (e.g. n-propyl and iso-propyl);

l and z
  are independently 0, 1, 2, 3, 4 or 5, preferably 0, 1 or 2.

The butadiene-styrene copolymer may be substituted with a residue which is capable of crosslinking by radiation. The residue which is capable of initiating cross linking by using radiation is for example based on at least one initiator comprising copopymerizable groups, wherein said initiator is copolymerized together with the monomers for preparing the radically crosslinkable organic compounds comprising at least one olefinic double bond and/or at least one triple bond in the main chain of the oligomer or polymer. Suitable initiators are for example: Initiators comprising vinyl groups or acrylate groups, e.g.

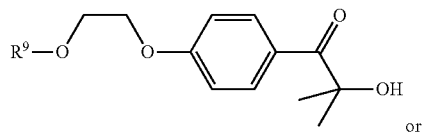

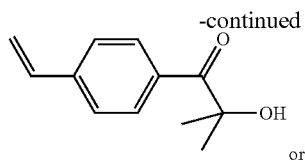

or

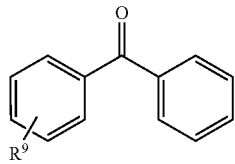

wherein
$R^9$ is independently

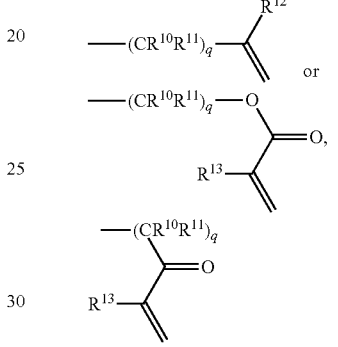

wherein
$R^{19}$ and $R^{11}$
  are independently H or $C_1$-$C_6$-alkyl, preferably $C_1$-$C_3$-alkyl, for example methyl, ethyl, propyl (e.g. n-propyl and iso-propyl), more preferably H; and q is 0, 1, 2 or 3; and $R^{12}$ and $R^{13}$
  are independently H or alkyl, preferably H or $C_1$-$C_6$-alkyl, more preferably H or $C_1$-$C_3$-alkyl, for example H or methyl, ethyl, propyl (e.g. n-propyl and iso-propyl).

(iii) A Radically Crosslinkable Organic Compound Comprising at Least Olefinic Double Bond and/or at Least One Triple Bond in at Least One Side Chain Preferred radically crosslinkable organic compounds comprising at least one olefinic double bond and/or at least one triple bond in at least one side chain are polyesters, especially alkyd resins.

Alkyd resins are polyester resins which are modified by natural or synthetic fats or oils. Alkyd resins are usually prepared by esterifying polyhydrate alcohols, wherein at least one of the polyhydrate alcohols is trihydric, with polybasic carboxylic acids. Suitable polyhydric alcohols are mentioned before. A preferred polyhydric alcohol is glycerine. Suitable polybasic carboxylic acids are for example phthalic acid, isophthalic acid, terephthalic acid, the anhydrides of phthalic acid, isoptalic acid and terephthalic acid, phthalic acid monosulfonate, isophthalic acid monosulfonate, terephthalic monosulfonate, halogenphthalic acids like tetrachloro or tetrabromophthalic acid, oxalic acid, malonic acid, succinic acid, glutaric acid, adipic acid, piminilic acid, cork acid, acelaine acid, sebacine acid, undecane dicarboxylic acid, dodecane dicarboxylic acid, maleic acid, fumaric acid, itaconic acid, 1,2-cyclobutane dicarboxylic acid, 1,3-cyclobutane dicarboxylic acid, 1,2-cyclopentane dicarboxylic acid, 1,3-cyclopentane dicarboxylic acid, hexahydrophthalic acid, 1,6-cyclohexane dicarboxylic acid, 1,4-cyclohexane dicarboxylic acid, 4-methylhexahydrophthalic acid, tricyclodecane dicarboxylic acid, tetrahydrophthalic acid or 4-methyltetrahydrophthalic acid. The cycloaliphatic dicarboxylic acid may be used in the cis- or trans-form or as mixture of both forms.

Suitable polyhydric alcohols are the alcohols mentioned before concerning the polyetheracrylates mentioned under numeral (i).

Suitable fats or oils are alkylmonocarboxylic acids of natural oils like linseed oil, soybean oil, tall oil, sufflower oil, sunflower oil, cotton seed oil, castor oil, groundnut oil, wood oil or ricinene oil fatty acid. Also suitable are isononanoic acid, 2-ethylhexanoic acid, coconut fatty acid, stearic acid and/or Juvandole fatty acid. Examples of suitable aromatic monocarboxylic acids are benzoic acid and p-tert.-butyl benzoic acid.

A preferred alkyd resin is for example a resin of the following formula:

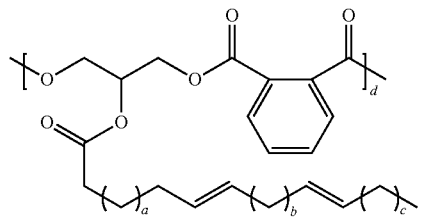

wherein
a and c
are independently 1 to 20, preferably 1 to 10, more preferably 1, 2, 3, 4, 5, 6, 7 or 8;
b is 0 or 1;
d is 1 to 1000, preferably 10 to 900, more preferably 100 to 800.

In a preferred embodiment the alkyd resin has the following formula:

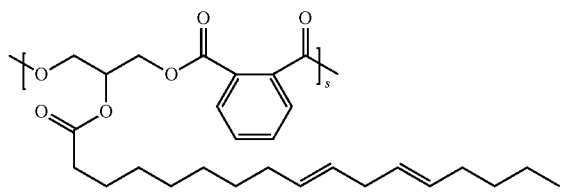

wherein
s is 1 to 1000, preferably 10 to 900, more preferably 100 to 800.

The alkyd resins may be substituted by a residue capable of crosslinking in the presence of radiation. The residue which is capable of initiating cross linking by using radiation is for example based on at least one initiator comprising copopymerizable groups, wherein said initiator is copolymerized together with the monomers for preparing the radically crosslinkable organic compounds comprising at least one olefinic double bond and/or at least one triple bond in the main chain of the oligomer or polymer. Suitable initiators are for example: Initiators comprising vinyl groups or acrylate groups, e.g.

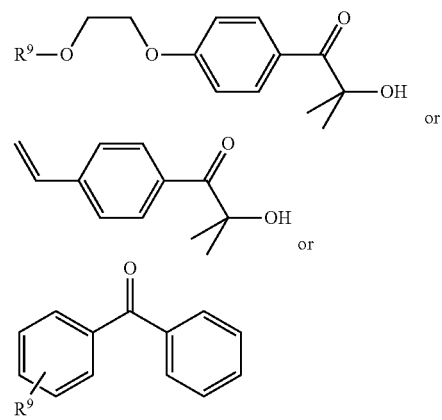

wherein
$R^9$ is independently

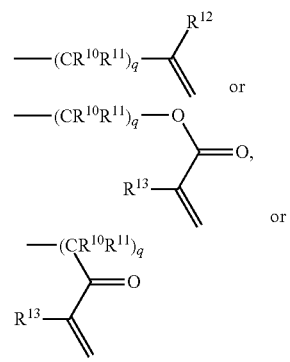

wherein
$R^{19}$ and $R^{11}$
are independently H or $C_1$-$C_6$-alkyl, preferably $C_1$-$C_3$-alkyl, for example methyl, ethyl, propyl (e.g. n-propyl and iso-propyl), more preferably H; and q is 0, 1, 2 or 3; and
$R^{12}$ and $R^{13}$
are independently H or alkyl, preferably H or $C_1$-$C_6$-alkyl, more preferably H or $C_1$-$C_3$-alkyl, for example H or methyl, ethyl, propyl (e.g. n-propyl and iso-propyl).

Most preferably, the radically crosslinkable organic compound is a compound selected from the group consisting of triacrylates, butadiene-styrene copolymers and alkyd resins, wherein even more preferred triacrylates as well as more preferred butadiene-styrene copolymers and more preferred alkyd resins have been mentioned before.

As used herein, "alkyl" refers to a straight-chain or branched saturated hydrocarbon group. Examples of alkyl groups include methyl (Me), ethyl (Et), propyl (e.g., n-propyl and iso-propyl), butyl (e.g., n-butyl, iso-butyl, sec-butyl, tert-butyl), pentyl groups (e.g., n-pentyl, iso-pentyl, neopentyl), hexyl groups, and the like. In various embodiments, an alkyl group can have 1 to 40 carbon atoms (i.e., $C_{1-40}$ alkyl group), for example, 1-20 carbon atoms (i.e., $C_{1-20}$ alkyl group). In some embodiments, an alkyl group can have 1 to 6 carbon atoms, and can be referred to as a "lower alkyl group". Examples of lower alkyl groups include methyl, ethyl, propyl (e.g., n-propyl and iso-propyl), butyl (e.g., n-butyl, iso-butyl, sec-butyl, tert-butyl), and hexyl groups. In some embodiments, alkyl groups can be substituted as described herein.

As used herein, "alkenyl" refers to a straight-chain or branched alkyl group having one or more carbon-carbon double bonds. Examples of alkenyl groups include ethenyl, propenyl, butenyl, pentenyl, hexenyl, butadienyl, pentadienyl, hexadienyl groups, and the like. The one or more carbon-carbon double bonds can be internal (such as in 2-butene) or terminal (such as in 1-butene). In various embodiments, an alkenyl group can have 2 to 40 carbon atoms (i.e., $C_{2-40}$ alkenyl group), for example, 2 to 20 carbon atoms (i.e., $C_{2-20}$ alkenyl group). In some embodiments, alkenyl groups can be substituted as described herein. The alkenyl groups may for example additionally comprise triple bonds.

As used herein, "alkynyl" refers to a straight-chain or branched alkyl group having one or more triple carbon-carbon bonds. Examples of alkynyl groups include ethynyl, propynyl, butynyl, pentynyl, hexynyl, and the like. The one or more triple carbon-carbon bonds can be internal (such as in 2-butyne) or terminal (such as in 1-butyne). In various embodiments, an alkynyl group can have 2 to 40 carbon atoms (i.e., $C_{2-40}$ alkylnyl group), for example, 2 to 20 carbon atoms (i.e., $C_{2-20}$ alkynyl group). In some embodiments, alkynyl groups can be substituted as described herein.

As used herein, "cycloalkyl" refers to a non-aromatic carbocyclic group including cyclized alkyl, alkenyl, and alkynyl groups. In various embodiments, a cycloalkyl group can have 3 to 20 carbon atoms, for example, 3 to 14 carbon atoms (i.e., $C_{3-14}$ cycloalkyl group). A cycloalkyl group can be monocyclic (e.g., cyclohexyl) or polycyclic (e.g., containing fused, bridged, and/or spiro ring systems), where the carbon atoms are located inside or outside of the ring system. Any suitable ring position of the cycloalkyl group can be covalently linked to the defined chemical structure. Examples of cycloalkyl groups include cyclopropyl, cyclobutyl, cyclopentyl, cyclohexyl, cycloheptyl, cyclopentenyl, cyclohexenyl, cyclohexadienyl, cycloheptatrienyl, norbornyl, norpinyl, norcaryl, adamantyl, and spiro[4.5]decanyl groups, as well as their homologs, isomers, and the like. In some embodiments, cycloalkyl groups can be substituted as described herein.

As used herein, "heteroatom" refers to an atom of any element other than carbon or hydrogen and includes, for example, nitrogen, oxygen, silicon, sulphur, phosphorus, and selenium.

As used herein, "cycloheteroalkyl" refers to a non-aromatic cycloalkyl group that contains at least one ring heteroatom selected from O, S, Se, N, P, and Si (e.g., O, S, and N), and optionally contains one or more double or triple bonds. A cycloheteroalkyl group can have 3 to 20 ring atoms, for example, 3 to 14 ring atoms (i.e., 3-14 membered cycloheteroalkyl group). One or more N, P, S, or Se atoms (e.g., N or S) in a cycloheteroalkyl ring may be oxidized (e.g., morpholine N-oxide, thiomorpholine S-oxide, thiomorpholine S,S-dioxide). In some embodiments, nitrogen or phosphorus atoms of cycloheteroalkyl groups can bear a substituent, for example, a hydrogen atom, an alkyl group, or other substituents as described herein. Cycloheteroalkyl groups can also contain one or more oxo groups, such as oxopiperidyl, oxooxazolidyl, dioxo-(1H,3H)-pyrimidyl, oxo-2(1H)-pyridyl, and the like. Examples of cycloheteroalkyl groups include, among others, morpholinyl, thiomorpholinyl, pyranyl, imidazolidinyl, imidazolinyl, oxazolidinyl, pyrazolidinyl, pyrazolinyl, pyrrolidinyl, pyrrolinyl, tetrahydrofuranyl, tetrahydrothiophenyl, piperidinyl, piperazinyl, and the like. In some embodiments, cycloheteralkyl groups can substituted as described herein.

As used herein, "aryl" refers to an aromatic monocyclic hydrocarbon ring system or a polycyclic ring system in which two or more aromatic hydrocarbon rings are fused (i.e., having a bond in common with) together or at least one aromatic monocyclic hydrocarbon ring is fused to one or more cycloalkyl and/or cycloheteroalkyl rings. An aryl group can have 6 to 20 carbon atoms in its ring system (e.g., $C_{6-20}$ aryl group), which can include multiple fused rings. In some embodiments, a polycyclic aryl group can have from 8 to 20 carbon atoms. Any suitable ring position of the aryl group can be covalently linked to the defined chemical structure. Examples of aryl groups having only aromatic carbocyclic ring(s) include phenyl, 1-naphthyl (bicyclic), 2-naphthyl (bicyclic), anthracenyl (tricyclic), phenanthrenyl (tricyclic), and like groups. Examples of polycyclic ring systems in which at least one aromatic carbocyclic ring is fused to one or more cycloalkyl and/or cycloheteroalkyl rings include, among others, benzo derivatives of cyclopentane (i.e., an indanyl group, which is a 5,6-bicyclic cycloalkyl/aromatic ring system), cyclohexane (i.e., a tetrahydronaphthyl group, which is a 6,6-bicyclic cycloalkyl/aromatic ring system), imidazoline (i.e., a benzimidazolinyl group, which is a 5,6-bicyclic cycloheteroalkyl/aromatic ring system), and pyran (i.e., a chromenyl group, which is a 6,6-bicyclic cycloheteroalkyl/aromatic ring system). Other examples of aryl groups include benzodioxanyl, benzodioxolyl, chromanyl, indolinyl groups, and the like. In some embodiments, aryl groups can be substituted as described herein, an aryl group can have one or more halogen substituents, and can be referred to as a "haloaryl" group. Perhaloaryl groups, i.e., aryl groups where all of the hydrogen atoms are replaced with halogen atoms (e.g., —CeFs), are included within the definition of "haloaryl." In certain embodiments, an aryl group is substituted with another aryl group and can be referred to as a biaryl group. Each of the aryl groups in the biaryl group can be substituted as disclosed herein.

As used herein, "heteroaryl" refers to an aromatic monocyclic ring system containing at least one ring heteroatom selected from oxygen (O), nitrogen (N), sulfur (S), silicon (Si), and selenium (Se) or a polycyclic ring system where at least one of the rings present in the ring system is aromatic and contains at least one ring heteroatom. Polycyclic heteroaryl groups include two or more heteroaryl rings fused together and monocyclic heteroaryl rings fused to one or more aromatic carbocyclic rings, non-aromatic carbocyclic rings, and/or non-aromatic cycloheteroalkyl rings. A heteroaryl group, as a whole, can have, for example, 5 to 20 ring atoms and contain 1-5 ring heteroatoms (i.e., 5-20 membered heteroaryl group). The heteroaryl group can be attached to the defined chemical structure at any heteroatom or carbon atom that results in a stable structure. Generally, heteroaryl rings do not contain O—O, S—S, or S—O bonds. However, one or more N or S atoms in a heteroaryl group can be oxidized (e.g., pyridine N-oxide, thiophene S-oxide, thiophene S,S-dioxide). Examples of heteroaryl groups include, for example, the 5- or 6-membered monocyclic and 5-6 bicyclic ring systems shown below:

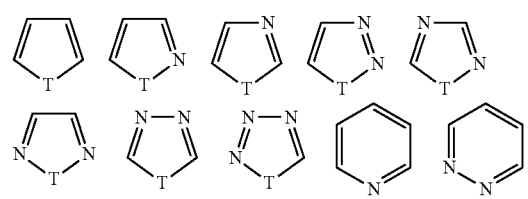

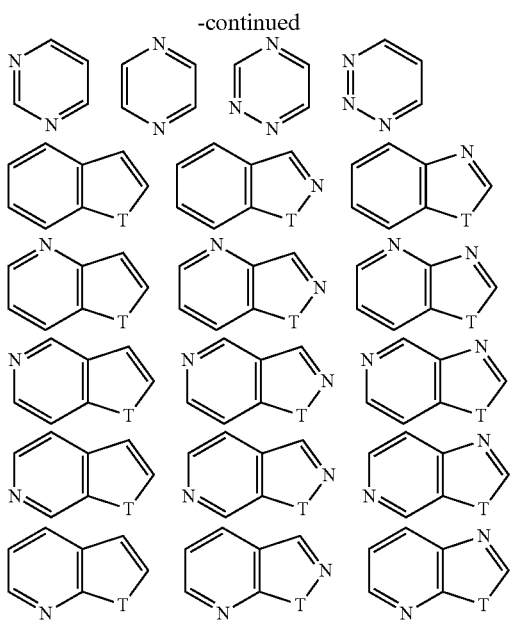

where T is O, S, NH, N-alkyl, N-aryl, N-(arylalkyl) (e.g., N-benzyl), $SiH_2$, SiH(alkyl), $Si(alkyl)_2$, SiH(arylalkyl), $Si(arylalkyl)_2$, or Si(alkyl)(arylalkyl). Examples of such heteroaryl rings include pyrrolyl, furyl, thienyl, pyridyl, pyrimidyl, pyridazinyl, pyrazinyl, triazolyl, tetrazolyl, pyrazolyl, imidazolyl, isothiazolyl, thiazolyl, thiadiazolyl, isoxazolyl, oxazolyl, oxadiazolyl, indolyl, isoindolyl, benzofuryl, benzothienyl, quinolyl, 2-methylquinolyl, isoquinolyl, quinoxalyl, quinazolyl, benzotriazolyl, benzimidazolyl, benzothiazolyl, benzisothiazolyl, benzisoxazolyl, benzoxadiazolyl, benzoxazolyl, cirrnolinyl, 1H-indazolyl, 2H-indazolyl, indolizinyl, isobenzoiuyl, naphthyridinyl, phthalazinyl, pteridinyl, purinyl, oxazolopyridinyl, thiazolopyridinyl, imidazopyridinyl, furopyridinyl, thienopyridinyl, pyridopyrimidinyl, pyridopyrazinyl, pyridopyridazinyl, thienothiazolyl, thienoxazolyl, thienoimidazolyl groups, and the like. Further examples of heteroaryl groups include 4,5,6,7-tetrahydroindolyl, tetrahydroquinolinyl, benzothienopyridinyl, benzofuropyridinyl groups, and the like. In some embodiments, heteroaryl groups can be substituted as described herein.

As used herein, "alkylene" refers to a straight-chain or branched saturated hydrocarbon group. Examples of alkylene groups include methylene, ethylene, propylene, butylene, pentylene groups, hexylene groups, and the like. In various embodiments, an alkylene group can have 1 to 40 carbon atoms (i.e., $C_{1-40}$ alkylene group), for example, 1-20 carbon atoms (i.e., $C_{1-20}$ alkylene group). In some embodiments, an alkylene group can have 1 to 6 carbon atoms. In some embodiments, alkylene groups can be substituted as described herein.

Crosslinking

The at least one compound which is radically crosslinkable used in the dielectric layer of the electronic device according to the present invention is crosslinkable by any method known by a person skilled in the art. Preferably, the radically crosslinkable organic compound is crosslinkable by using radiation and/or thermal energy, usually in the presence of an initiator.

In the context of the present invention the term "crosslinkable by using thermal energy" is equivalent to the term "thermal curing" and denotes the heat-initiated curing of a layer of coating material. Thermal curing is commonly initiated by means of thermal initiators. Suitable thermal initiators are mentioned below.

In the context of the present invention "crosslinkable by using radiation" means crosslinkable by actinic radiation, especially electron beams or, preferably, UV radiation. Crosslinking by UV radiation is commonly initiated by means of free-radical photo initiators. Suitable photo initiators are mentioned below.

Where the crosslinking using thermal energy (thermal curing) and the crosslinking using radiation (curing with actinic light) are employed conjointly for one material, the term "dual cure" is also used.

In a preferred embodiment of the present invention the crosslinking is carried out by radiation, more preferably UV radiation. By crosslinking via radiation a selective structuring is possible.

In a further embodiment of the present invention the electronic device according to the present invention therefore comprises at least one compound which is radically crosslinkable, whereby said compound is crosslinked in the presence of at least one initiator. Suitable initiators are preferably selected from the group consisting of peroxides (R—O—O—R'), hydroperoxides (R—O—OH), peresters (R—C(O)O—OR'), azo compounds (RN=NR'), sterically hindered ethane derivatives (RR'C—CR"R'''), persulfates, acyloin and derivatives thereof, diketones, phenones, organic sulfides and S-acyl-thiocarbamates, wherein R, R', R" and R''' are alkyl, cycloalkyl aryl or heteroaryl groups.

Suitable peroxides are for example 1,1-di(tert-butylperoxy)-3,3,5-trimethylcyclohexane, 1,1-di(tert-amylperoxy)cyclohexane, 1,1-di(tert-butylperoxy)cyclohexane, 2,2-di(tertbutylperoxy)butane, butyl-4,4-di(tert-butylperoxy)valerate, di-tert-amylperoxide, dicumylperoxide, di(tert-butylperoxyisopropyl)benzoin, 2,5-dimethyl-2,5-di(tert-butylperoxy)hexane, tert-butylcumylperoxide, 2,5-dimethyl-2,5-di(tert-butyperoxy)hexyne-3, di-tert-butylperoxide, 3,6,9-triethyl-3,6,9-trimethyl-1,4,7-triperoxononane.

Suitable hydroperoxides are for example isopropylcumylhydroperoxide, 1,1,3,3-tetramethylbutylhydroperoxide, cumylhydroperoxide, tert-butylhydroperoxide and tertamylhydroperoxide.

Suitable peresters are monoesters as well as diesters, preferably diisobutyrylperoxide, cumylperoxydodecanoate, di(3-methoxybutyl)peroxydicarbonate, 1,1,3,3-tetramethylbutylperoxydodecanoate, cumylperoxyheptanoate, tert-amylperoxydodecanoate; peroxydicarbonates and mixtures of peroxydicarbonates, having the following formula:

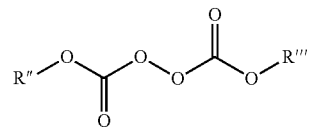

wherein
R" and R''' are alkyl or cycloalkyl, preferably di-sec-butylperoxydicarbonate, diisopropylperoxydicarbonate, di(4-tert-butylcyclohexyl)peroxydicarbonate, di(2-ethylhexyl)peroxydicarbonate, tert-butylperoxydodecanoate, dicetylperoxydicarbonate, dimyristylperoxydicarbonate; 1,1,3,3-tetramethylbutylperoxypivalate, tert-butylperoxyheptanoate, tertamylperoxypivalate, tert-butylperoxypivalate, di(3,5,5-trimethylhexanoyl)peroxide, dilauroylperoxide, didecanoylperoxide, 2,5-dimethyl-2,5-di(2- ethylhexanoylperoxy)hexane, 1,1,3,3-tetramethylbutylperoxy-2-ethylhexanoate, tert-amylperoxy-2-ethylhexanoate, dibenzoylperoxide, tert-butylperoxy-2-ethylhexanoate, tert-butylperoxydiethylacetate, tert-butylperoxyisobutylate, tert-amylperoxy-2-ethylhexylcarbonate, tert-amylperoxyacetate, tert-butylperoxy-3,5,5-trimethylhexanoate, tert-butylperoxyisopropylcarbonate, tert-butylperoxy-2-ethyhexylcarbonate, tert-amylperoxybenzoate, tert-butylperoxyacetate, tert-butylperoxybenzoate.

Suitable azo compounds are for example 2, 2'-azodi(isobutylonitrile), 2,2'-azodi(2-methylbutylonitrile) and 1,1'-azodi(hexahydrobenzonitrile).

A suitable sterically hindered ethane derivative is for example 2,3-dimethyl-2,3-diphenylbutane.

Acyloin and derivatives thereof are for example benzoin, benzoinmethylether, benzomethylether, benzoinisopropylether, benzoinisobutylether and (α)-methylbenzoin.

Suitable diketones are for example dibenzyl ketone and diacetyl ketone.

Suitable organic sulfides are for example diphenylmonosulfide, diphenyldisulfide, decylphenylsulfide and tetramethylthiuram monosulfide.

A suitable S-acylthiocarbamat is for example S-benzoyl-N,N-dimethyldithiocarbamat.

Suitable phenones are acetophenone, benzophenone and derivatives thereof. Examples of suitable phenones are:

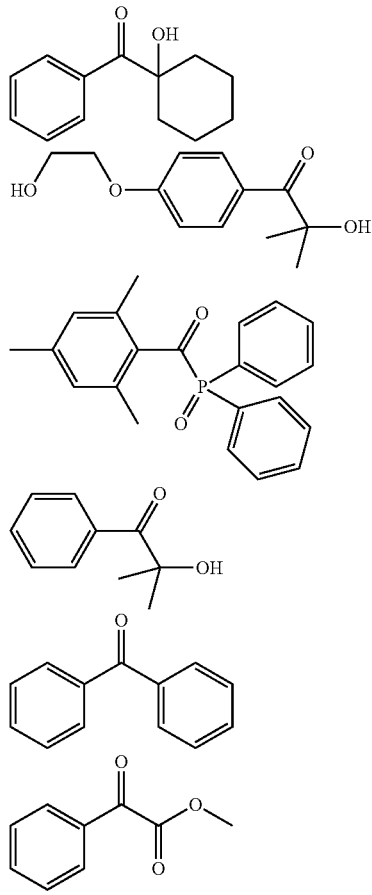

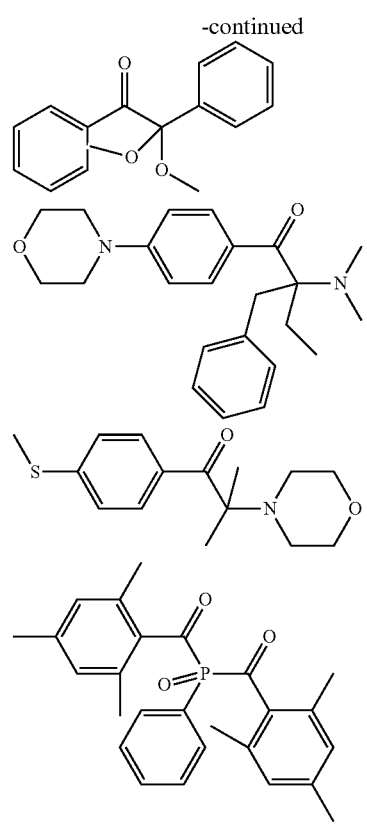

The phenones mentioned above are commercially available under the trade names Irgacure™ and Darocur™ of Ciba®.

Further examples are initiators which are self incorporating during crosslinking, for example initiators comprising vinyl groups or acrylate groups, e.g.

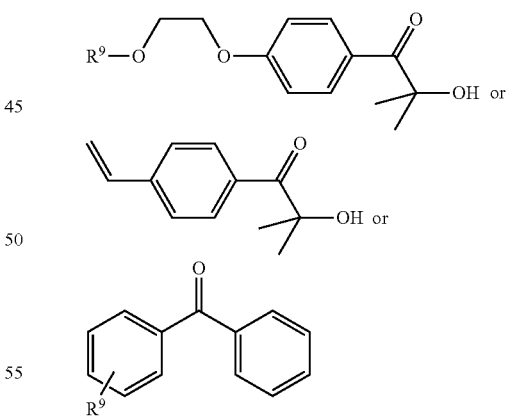

wherein
R9 is independently

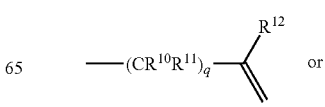

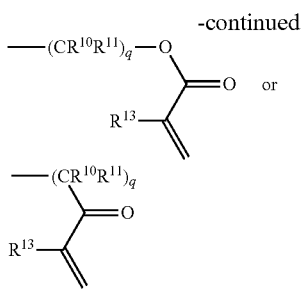

wherein $R^{10}$ and $R^{11}$
are independently H or $C_1$-$C_6$-alkyl, preferably $C_1$-$C_3$-alkyl, for example methyl, ethyl, propyl (e.g. n-propyl and iso-propyl), more preferably H; and q is 0, 1, 2 or 3; and $R^{12}$ and $R^{13}$
are independently H or alkyl, preferably H or $C_1$-$C_6$-alkyl, more preferably H or $C_1$-$C_3$-alkyl, for example H or methyl, ethyl, propyl (e.g. n-propyl and iso-propyl).

The initiators comprising vinyl groups or acrylate groups may also be used as co-monomers which may be copolymerized together with the monomers for preparing the radically crosslinkable organic compounds mentioned above. Further, the initiators comprising vinyl groups or acrylate groups may be copolymerized together with the monomers for preparing the non-crosslinkable polymer which may be used in the formulations comprising the radically crosslinkable organic compounds according to the present invention mentioned below to adjust the viscosity of the formulations.

The initiators mentioned above are commercially available or preparable by known preparation methods.

Usually, the initiator will be used in an amount of from 0.01 to 20% by weight, preferably 0.1 to 15% by weight, more preferably 1% to 10% by weight, based on the amount of the radically crosslinkable organic compound.

The radically crosslinkable organic compound used as precursor for the crosslinked organic compound of the dielectric layer in the electronic device according to the present invention may be self-curable (self-crosslinking). This means that the groups of the radically crosslinkable organic compound comprise functionable groups which react with one another or with a crosslinking substance with bond formation, i.e. crosslinking by the action of radiation and/or by the use of thermal energy. Suitable functional groups are mentioned above.

One of the advantages of the radically crosslinked organic compounds comprised in the dielectric layer of the electronic devices according to the present invention is their ability to crosslink, for example photo-crosslink and/or thermally crosslink, after deposition onto a substrate. This allows the formation of a polymeric matrix that is crosslinked to a specific degree at a specific wavelength and/or temperature, depending on the nature of the organic compound and optionally the initiator used. The crosslinked polymeric matrix is robust enough to withstand various conditions that are common in device fabrication processes, including patterning and subsequent solution-phase processes, for example, to form/deposit overlying layers (e.g., the semi-conductor layer in a bottom-gate OTFT-structure or the gate layer for a top-gate OTFT-structure). Subsequent to the formation of the crosslinked matrix, the dielectric layers in the electronic device according to the present invention can be subject to further patterning and process step by which additional layers, including additional dielectric, semi-conductor and/or conducting layers can be formed on top of the dielectric material.

Formulations

Usually, the radically crosslinkable organic compounds according to the present invention are applied onto a substrate in form of formulations of the radically crosslinkable organic compounds.

Formulations of the at least one radically crosslinkable organic compounds described in the present invention can be used in various solution-phase processes for preparing/depositing the dielectric layer of the electronic device according to the present invention. Suitable solution-phase processes include, but not limited to, spin-coating, printing, drop-casting, dip-coating, spraying and blade coating. Spin-coating involves applying an excess amount of the coating solution onto the substrate, then rotating the substrate at high speed to spread the fluid by centrifugal force. The thickness of the resulting dielectric film prepared by this technique is dependent on the spin-coating rate, the concentration of the solution, as well as the solvent used. Printing can be performed, for example, with a rotogravel printing press, a flexoprinting press, pad printing, screen printing or an ink jet printer. The thickness of the dielectric layer as processed by these printing methods can be dependent on the concentration of the solution, the choice of solvent and the number of printing repetitions. Ambient conditions such as temperature, pressure and humidity can also affect the resulting thickness of the film. Depending on the specific printing techniques used, printing quality can be affected by different parameters including, but not limited to, rheological properties of the formulations such as tension energy and viscosity.

Suitable solvents for preparing the formulations of the radically crosslinkable organic compounds according to the present application are all common solvents, wherein said crosslinkable organic compounds having satisfactory solubility. Examples of common organic solvents include, but are not limited to, petroleum ethers, aromatic hydrocarbons such as benzene, chlorobenzene, dichlorobenzene, cyclohexylbenzene, toluene, anisole, xylene and mesitylene; ketones such as acetone, 2-butanone, cyclopentanone, and cyclohexanone; ethers such as tetrahydrofurane, diethylether, bis(2-methoxyethyl)ether, and dioxane; alcohols such as ethanol, propanol, and isopropyl alcohol, ethyllactate; aliphatic hydrocarbons such as hexanes and cyclohexanes; acetates, such as ethylacetate, n- and iso-propylacetate, n-, iso-, sec- and tertbutylacetate; halogenated aliphatic hydrocarbons such as dichloromethane, chloroform and ethylenechloride; and other aprotic solvents such as dimethylformamide, dimethylsulfoxide, and N-methylpyrrolidone, and mixtures of two or more of said solvents. Preferred solvents are ethyllactate, cyclopentanone, cyclohexanone, acetates, for example acetates comprising a $C_1$- to $C_6$-alkyl residue, such as isopropylacetate and n-butylacetate and mixtures of two or more thereof.

In a further embodiment of the present invention the at least one compound which is radically crosslinkable, used as precursor for the dielectric layer of the electronic device according to the present invention is employed—usually together with at least one initiator—in a mixture with at least one reactive diluent and/or with at least one non-crosslinkable polymer. By addition of the reactive diluent and/or the non-crosslinkable polymer it is possible to adjust the viscosity of the at least one compound which is radically crosslinkable.

Reactive diluents are low molecular weight, liquid compounds which have at least one polymerizable, ethylenically unsaturated double bond. An overview of reactive diluents is to be found for example in J. P. Fouassier (editor), Radiation Curing in Polymer Science and Technology, Elsevier Science Publisher Ltd., 1993, vol. 1, pp. 237-240. Reactive diluents based on esters of acrylic acid or of methacrylic acid with aliphatic di- or polyols are suitable, at least two of the OH-groups of the di- or polyols being esterified with acrylic acid or methacrylic acid. Suitable aliphatic di- or polyols have, as a rule, 2 to 20 carbon atoms and may have a linear, branched or cyclic carbon skeleton. They preferably comprise no functional groups. Apart from one or two ether oxygens, they preferably have no heteroatoms. Examples of such reactive diluents are butanedioldiacrylate, hexanedioldiacrylate, octanedioldiacrylate, decanedioldiacrylate, cyclohexanedioldiacrylate, trimethylolpropanetriacrylate, pentaerythrityltetraacrylate, dipentaerythritylpenta/hexaacrylate, dipropyleneglycoldiacrylate and the corresponding esters of methacrylic acid as well as the products LR8887, PO33F, LR8967 and LR8982 sold under the Laromer® brands of BASF SE. Other suitable reactive diluents are (meth)acrylic acid and the $C_1$-$C_{10}$-alklylesters thereof, maleic acid and the $C_1$-$C_{10}$-alkylesters or monoesters thereof, vinylacetate, vinylether, divinylureas, polyethyleneglycoldi(meth)acrylate, vinyl(meth)acrylate, allyl(meth)acrylate, styrene, vinyltoluene, divinylbenzene, tris(acryloyloxymethyl)isocyanurate, ethoxyethoxyethylacrylate, N-vinylpyrrolidone, phenoxyethylacrylate, dimethylaminoethylacrylate, hydroxylethyl(meth)acrylate, butoxyethylacrylate, isobornyl (meth)acrylate, dimethacrylamide and dicyclopentylacrylate as well as the long-chain linear diacrylates described in EP 0 250 631 A1 and having a molecular weight of from 400 to 4000, preferably 600 to 2500, Dalton. The reaction product of 2 mol acrylic acid with one mol of a dimeric fatty alcohol which has in general 36 carbon atoms may also be used. Mixtures of said compounds mentioned before are also suitable.

Suitable non-crosslinkable polymers which are used together with the at least one compound which is radically crosslinkable are polymers having good film forming properties. Examples of suitable non-crosslinkable polymers are poly(meth)acrylates, polystyrene, polymers of styrene derivatives like polymers of methylstyrene, ethylstyrene or vinyltoluene, polyesters like PMMA (polymethylmethacrylate), polycyclohexylmethacrylate, poly(MMA-co-S) (copolymer of methylmethacrylate and styrene), poly(methoxystyrene) (PMeOS), poly(MeOS-co-S) (copolymer of methoxystyrene and styrene), polyacetoxystyrene (PAcOS), poly(AcOS-co-S) (copolymer of acetoxystyrene and styrene), poly(S-co-vinyltoluene) (copolymer of styrene and vinyltoluene), polysulfones and mixtures thereof.

The at least one compound which is radically crosslinkable and which is the precursor for the crosslinked organic compounds used in the dielectric layer of the electronic device according to the present invention may in one embodiment of the present invention be employed in a mixture with at least one additive selected from the group consisting of fillers, diluents, rheological thickeners, colorants, surfactants, film forming agents and stabilizer Useful fillers are for example fillers having a high dielectric constant. Dielectric incorporating superfine theramic particles have been used to make OTFTs and are discussed in the U.S. application having the US serial number No. 09/619, 302, filed Jul. 19, 2000. Other useful fillers with high dielectric constants include paraelectric ceramic fillers such as bariumtitanate, strontiumtitanate, led zirconate and many other fillers that have a high dielectric constant such as those disclosed in U.S. Pat. No. 6,159,611. It may also be useful to coat the fillers with a coupling agent (e.g., silane coupling agents) or a "ligand/dispersant" in order to make them compatible with the radically crosslinked organic compound. Other suitable fillers include metal oxides (e.g., $SiO_2$, $Al_2O_3$ and $TiO_2$), nitrides (e.g., $Si_3N_4$) as well as those disclosed in U.S. Pat. No. 5,126,915 and U.S. Pat. No. 5,358,775.

The diluents, rheological thickeners, colorants, surfactants and anti-oxidants which may also be useful as additives in a mixture with the radically crosslinkable organic compound are known by a person skilled in the art.

The dielectric layers in the electronic device according to the present invention comprising the radically crosslinked organic compound based on the radically crosslinkable organic compound discussed before usually have a dielectric constant of $\geq 2.3$, preferably of 2.5 to 10, more preferably of $>3$ to $<5$.

The thickness of the dielectric layer in the electronic device depends on the electronic device as well as on the technique for applying the dielectric layer. Usually, the thickness of the dielectric layer is from 10 to 5000 nm, preferably 50 to 1000 nm, more preferably 200 to 500 nm.

Electronic Devices

The electronic device according to the present invention comprising the dielectric layer comprising at least one radically crosslinked compound based on the radically crosslinkable organic compound mentioned before is preferably selected from the group consisting of a thin film transistor, a transistor array, a capacitor, an electroluminescent lamp and an integrated circuit. Consequently, the electronic device according to the present invention preferably further comprises a semi-conductor layer.

A suitable thin film transistor (TFT) preferably includes a substrate, a gate electrode disposed on the substrate, a dielectric material according to the present invention disposed on the gate electrode, an optional surface-modifying film disposed on the gate dielectric, a semi-conductor layer adjacent to the surface-modifying film, and a source electrode as well as a drain electrode contiguous to the semi-conductor layer, whereby the following structures (configurations) are preferably formed: Top-gate top-contact structures, top-gate bottom-contact structures, bottom-gate top-contact structures, and bottom-gate bottom-contact structures. Suitable structures are known by a person skilled in the art.

In the bottom-gate configurations, the source and the drain electrodes are defined either on top of the semi-conductor (top-contact), or the semi-conductor is deposited on top of the source or drain electrode and dielectric component (bottom-contact).

In the top-gate configuration, the gate lines are defined on top of the dielectric semiconductor layer.

In a further embodiment the present invention therefore concerns an electronic device according to the present invention wherein the device is a thin film transistor having a top gate configuration or a thin film transistor having a bottom gate configuration.

If the electronic device is a thin film transistor device including a dielectric layer comprising a radically crosslinked organic material as described in the present application, a semi-conductor layer, a gate electrode, a source electrode and a drain electrode, the dielectric layer is typically disposed between the semi-conductor layer and the gate electrode. The dielectric layer can be coupled to the semi-conductor layer either directly or via optionally present intervening layer(s) such as a protective or surface modifying interlayer.

The capacitor is preferably an embedded capacitor that preferably includes two flexible conductive substrates with a dielectric material of the present invention interposed between the two flexible substrates. The capacitor is embedded in a material such as a fiberglass/epoxy composite. An active electronic device is situated above the embedded capacitor and has electrical connections to conductive substrates. Embedded capacitors are used for low impedance power distribution in high speed electronic devices. A description of an embedded capacitor can for example be found in U.S. Pat. No. 6,274,224.

A suitable electroluminescent lamp according to the present invention includes a trans-parent conductive film (such as indium-tin-oxide) formed on an upper surface of an insulating transparent film (such as polyethyleneterephthalate). A light-emitting layer is pattern printed on the transparent conductive film by screen printing, for example. The composition of light-emitting layer is made by dissolving a high dielectric resin, such as cyanoethylpolulan or vinylidenfluoride group rubber in an organic solvent, such as dimethylformamide or N-methylpyrrolidinone, and then diffusing an illuminant, such as zinc sulfide, therein. A dielectric material of the present invention is formed on the light-emitting layer. A back-surface electrode is formed on the dielectric layer by using a carbon resin group paste or a silver resin group paste. An insulating coat layer is formed on the back-surface electrode layer by using, for instance, an insulating paste. Electrodes are formed on the conductive layers. A further description of these devices may be found in, for instance, U.S. Pat. No. 5,844,362.

Most preferably, the electronic device according to the present invention is a thin film transistor (TFT), especially an organic thin film transistor (OTFT), specifically, an organic field effect transistor (OFET).

The electronic device, preferably the thin film transistor (TFT), more preferably the organic thin film transistor (OTFT), even more preferably an organic field effect transistor (OFET), according to the present invention usually comprises a substrate. The substrate component can be selected from, but is not limited to, doped silicon, an indium tin oxide (ITO), ITO-coated glass, ITO-coated polyimides or other plastics, aluminum or other metals alone or coated on a polymer or other substrate, a doped polythiophene, and the like.

Further, the electronic device preferably comprises a semi-conductor. Suitable semiconductor components can be selected from, but are not limited to, various fused heterocycles, aromatic hydrocarbons, polythiophenes, fused (hetero)aromatics (e.g., perylene imides and naphthalene imides), and other such organic semi-conductor compounds or materials, whether p-type or n-type, otherwise known or found useful in the art. For example, the semi-conductor component can be prepared from one or more compounds and/or polymers as described in U.S. Pat. No. 6,585,914, U.S. Pat. No. 6,608,323, U.S. Pat. No. 6,991,749, US 2005/0176970, US 2006/0186401, US 2007/0282094, US 2008/0021220, US 2008/0167435, US 2008/0177073, US 2008/0185555, US 2008/1085577 and US 2008/0249309. The semi-conductor component also can include inorganic semiconductor materials such as silicon, germanium, gallium arsenide, methyloxide and the like.

Further, the electronic device according to the present invention can include one or more interlayers between the semi-conductor layer and the dielectric layer. Such interlayers can be electrically insulating and can be prepared from various dielectric polymers. In some embodiments, the one or more interlayers can be prepared from polymers such as fluoropolymers (e.g. Cytop®, Asahi Glass co., Wilmington, Del.; and Teflon® AF, Dupont, Wilmington, Del.), poly(isobutylene), poly(vinylphenol-co-methylmethacrylate), poly(vinylalcohol), poly(propylene), poly(vinylchloride), polycyanopulluane, poly(vinylphenyl), poly(vinylcyclohexane), benzocyclobutane-based polymers, poly(methylmethacrylate), poly(styrene-co-butadiene), poly(cyclohexylmethacrylate), poly(MMA-co-S) (copolymer of methylmethacrylate and styrene), poly(methoxystyrene) (PMeOS), poly(MeOS-co-S) (copolymer of methoxystyrene and styrene), poly(acetoxystyrene) (PAcOS), poly(AcOS-co-S) (copolymer of acetoxystyrene and styrene), poly(S-co-vinyltoluene) (copolymer of styrene and vinyltoluene), polysulfones, poly(vinylpyridine), poly(vinylidenfluoride), polyacrylonitrile, poly(4-vinylpyridine), poly(2-ethyl-2-oxazoline), poly(chlorotrifluoroethylene), polyvinylpyrrolidone and poly(pentafluorostyrene).

The electronic device according to the present invention can further include one or more electrical contacts. Such electrical contacts can be made of a metal (e.g. gold) and can function as source, drain or gate contacts.

Method of Making the Electronic Device

In a further embodiment the present invention relates to a method for making an electronic device according to the present invention comprising the step of radically crosslinking the at least one compound which is radically crosslinkable.

In a preferred embodiment the method includes preparing a composition of the radical crosslinkable organic compound mentioned above by dissolving said compound in a solvent and printing the composition onto a substrate to form a dielectric layer. The method further includes exposing the dielectric layer formed to a radiation source (preferably ultraviolet light) and/or to thermal energy to induce crosslinking, thereby forming the radically crosslinked organic compound present in the dielectric layer of the electronic device according to the present invention. The method can also include printing an additional dielectric layer onto the crosslinked dielectric layer to form a multilayer dielectric material.

In the following, some preferred embodiments of the method of making an electronic device according to the present invention are mentioned:

In one embodiment, the method can include preparing a formulation that includes one or more of the crosslinked organic compounds according to the present invention and no, one or several standard polymers, applying the formulation from solution, for example printing the formulation, onto a substrate (gate) to form a dielectric layer, forming a semiconductor layer above the dielectric material, and forming a first electrical contact and a second electrical contact (source and drain) on the semi-conductor layer, to fabricate a top-contact bottom-gate organic field effect transistor. The method includes exposing the dielectric layer to radiation and/or to thermal energy to induce crosslinking to form the radically crosslinked organic compound comprised in the dielectric material.

In a second embodiment, the method can include preparing a solution comprising one or more radically crosslinkable organic compounds as mentioned in the present applications, and no, one or several standard polymers, applying the formulation from solution, for example printing the formulation, onto a substrate (gate) to form a dielectric layer, forming a first electrical contact and a second electrical contact (source and drain) above the dielectric material, and forming a semiconductor layer, thus the first and second electrical contact and the dielectric material (i.e., to cover the electrical contact and an area of the dielectric material between the electrical contacts), to fabricate a bottom-contact bottom-gate organic field effect transistor. The method further includes exposing the dielectric layer to radiation and/or thermal energy to induce crosslinking to form the radically crosslinked organic material comprised in the dielectric layer.

The crosslinking may at the same time be used for structuring the dielectric layer, for example by crosslinking the dielectric layer and removing the non crosslinked parts by washing the substrates with a suitable solvent. Suitable solvents are solvents, wherein the non crosslinked compounds are soluble but the crosslinked compounds are insoluble and depend on the radically crosslinkable compounds used. Suitable solvents are known by a person skilled in the art. Examples for suitable solvents are the solvents mentioned above, which are employed for preparing the formulations of the radically crosslinkable organic compounds according to the present application.

In a third embodiment, the method can include forming a first electrical contact and a second electrical contact (source and drain) on a substrate, forming a semi-conductor layer above the substrate and the first and second electrical contacts (to cover the electrical contacts and an area of the substrate between the electrical contact), preparing a formulation that includes one or more radically crosslinkable organic materials as described in the present application and no, one or several standard polymers, applying the formulation from solution, for example printing the formulation, above the semiconductor layer to form a dielectric layer, forming a third electrical contact (gate) on the dielectric layer, wherein the third electric contact is above an area between the first and second electric contacts, to fabricate a bottom-contact top-gate organic field effect transistor. The method further includes exposing the radically crosslinkable organic compound (dielectric layer) to radiation and/or thermal energy to induce crosslinking to form a radically crosslinked organic compound comprised in the dielectric material. In some embodiments, the method can include forming an interlayer above the semiconductor layer before depositing the formulation of the radically crosslinkable organic compound forming the radically crosslinked organic compound comprised in the dielectric layer.

In a fourth embodiment, the method can include forming a semi-conductor layer on a substrate, forming a first electrical contact and a second electrical contact (source and drain) above the semi-conductor layer, preparing a formulation that includes one or more radically crosslinkable organic compounds as described in the present application and no, one or several standard polymers, printing the formulation above the first and second electrical contact and an area of the semi-conductor layer between the first and second electrical contact to form a dielectric layer, and forming a third electrical contact (gate) above the dielectric material, wherein the third electrical contact is above an area between the first and second electrical contacts, to fabricate a top-contact top-gate organic field effect transistor. The method further includes exposing the radically crosslinkable organic compound (dielectric layer) to radiation and/or thermal energy to induce crosslinking to form the radically crosslinked organic compound comprised in the dielectric layer. In some embodiments, the method can include forming an interlayer above the semi-conductor layer before depositing the dielectric polymer formulation.

The semi-conductor layer and the various electrical contacts can be formed by various deposition processes known to those skilled in the art. For example, the semi-conductor layer and the interlayer can be formed by processes such as, but not limited to, physical vapor deposition, different types of printing techniques (e.g. flexoprinting, lithoprinting, gravure printing, ink-jetting, pad printing, and so forth), drop casting, dip coating, doctor blading, roller coating, and spin coating. Electrical contacts can be formed by processes such as, but not limited to, thermal evaporation and radiofrequency for e-beam sputtering, as well as various deposition processes, including but not limited to those described immediately above.

The following examples are provided to illustrate further and to facilitate the understanding of the present teachings and are not in any way intended to limit the invention.

EXAMPLES

I Triacrylates, Alkyd Resins and Styrene-Butadiene Copolymers as Dielectrics I.1 Capacitor Fabrication (Triacrylates)

Dielectric formulations were prepared by dissolving 2 g of a triacrylate (a) trimethylolpropane trimethacrylate (TMPTMA), (b) trimethylol propane triacrylate (TMPTA), 200 mg of a poly(methylmethacrylate) (PMMA) and 80 mg of initiator (i) IRGACURE™ 500 of Ciba®, ii) IRGACURE™ 819 of Ciba®) in 10 mL of butylacetate. The formulations were spin-coated onto clean ITO substrates for 30 s at 3000 rpm (acceleration 20) to give films of thickness in the range of about 500 nm. ITO glass slides were cleaned by sonication in organic solvents before use. After the spin-coating step, the resulting dielectric films were irradiated using ultraviolet light. The UV wavelength was 256 nm in the case that IRGACURE™ 500 was used as initiator (examples I.1.a.i) and I.1.b.i)) and 365 nm in the case that IRGACURE™ 819 was used as initiator (examples I.1.a.ii) and I.1.b.ii)). The curing dose was 2000 mJ/cm$^2$. Intensity and dose were measured using a radiometer.

IRGACURE™ 500 of Ciba®:

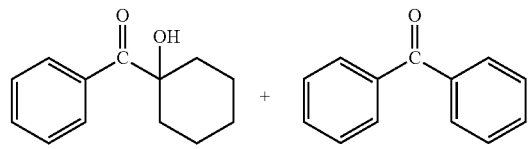 [SMILES: O=C(c1ccccc1)C1(O)CCCCC1 ; O=C(c1ccccc1)c1ccccc1]

IRGACURE™ 819 of Ciba®:

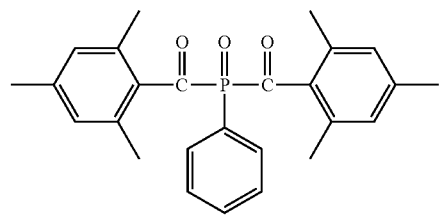

In FIG. 1 the leakage current density (current density J [A/cm$^2$] in relation to the electric field E [MV/cm] for the dielectric films of examples I.1.a.i), I.1.a.ii), I.1.b.i) and I.1.b.ii) is shown.

The curve of the black rhombus in FIG. 1 shows the leakage current density of a dielectric film according to example I.1.a.i) (TMPTMA, 500 nm, cured at 256 nm).

The curve of the grey rhombus in FIG. 1 shows the leakage current density of a dielectric film according to example I.1.a.ii) (TMPTMA, 500 nm, cured at 365 nm).

The curve of the black plus in FIG. 1 shows the leakage current density of a dielectric film according to example I.1.b.i) (TMPTA, 500 nm, cured at 256 nm).

The curve of the grey plus in FIG. 1 shows the leakage current density of a dielectric film according to example I.1.b.ii) (TMPTA, 500 nm, cured at 365 nm).

I.2 Capacitor Fabrication (Alkyd Resins)

a) Dielectric formulation was prepared by dissolving 3 g of Vialkyd® AM 342 Formulation (comprising an initiator) (Cytec industries), in 10 mL of butylacetate. The formulation was spin-coated onto clean ITO substrates for 30 s at 3500 rpm (acceleration 20) to give films of thickness in the range of about 500 nm. ITO glass slides were cleaned by sonication in organic solvents before use. After the spin-coating step, the resulting dielectric films were cured using either irradiation with ultraviolet light (220-380 nm) (example I.2.a.i)) or thermal treatment in a vacuum oven (120° C., 1 h) (example I.2.a.ii)). The curing dose was 2000 mJ/cm². Intensity and dose were measured using a radiometer.

b) Dielectric formulation was prepared by dissolving 2 g of Uralac® AM 352 Formulation (comprising an initiator ((DSM Resins), in 6 mL of butylacetate. The formulation was spin-coated onto clean ITO substrates for 30 s at 3800 rpm (acceleration 20) to give films of thickness in the range of about 500 nm. ITO glass slides were cleaned by sonication in organic solvents before use. After the spin-coating step, the resulting dielectric films were cured using either irradiation with ultraviolet light 256 nm (example I.2.b.i)) or thermal treatment in a vacuum oven (120° C., 1 h) (example I.2.b.ii)). The curing dose was 2000 mJ/cm². Intensity and dose were measured using a radiometer.

Figure 2:
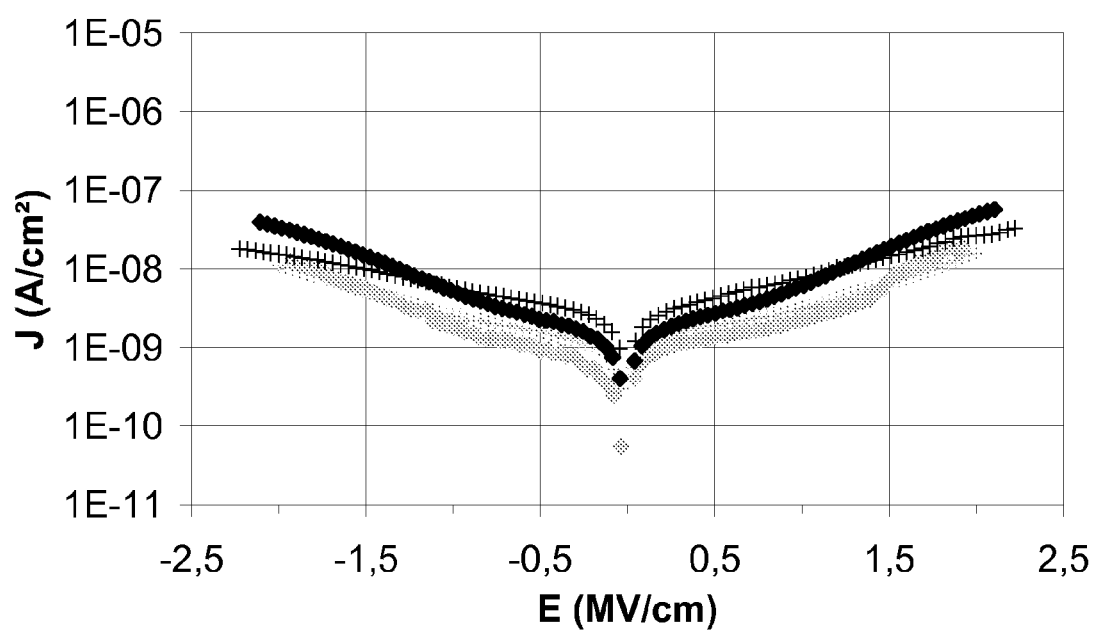
FIG. 2 shows leakage current density J versus electric field E for the dielectric films of examples 1.2.a.i), I.2.a.ii), I.2.b.i) and I.2.b.ii).

In FIG. 2 the leakage current density (current density J [A/cm²] in relation to the electric field E [MV/cm] for the dielectric films of examples I.2.a.i), I.2.a.ii), I.2.b.i) and I.2.b.ii) is shown.

The curve of the grey rhombus in FIG. 2 shows the leakage current density of a dielectric film according to example I.2.a.i) (Vinylalkyd® AM 342, 520 nm, 2000 mJ/cm²).

The curve of the black rhombus in FIG. 2 shows the leakage current density of a dielectric film according to example I.2.a.ii) (Vinylalkyd® AM 342, 475 nm, 1 h, 120° C.).

The curve of the plus (+) in FIG. 2 shows the leakage current density of a dielectric film according to example I.2.b.i) (Uralac® AM, 500 nm, 2000 mJ/cm²).

The curve of the bold plus (+) in FIG. 2 shows the leakage current density of a dielectric film according to example I.2.b.ii) (Uralac® AM, 500 nm, 1 h, 120° C.).

I.3 Capacitor Fabrication (Styrene-Butadiene Copolymers)

a) Dielectric formulation was prepared by dissolving 1 g of a random styrene-butadiene-copolymer (ca. 26% butadiene, 74% styrene, Mw ~175.000, PDI ~2) and 80 mg of the initiator IRGACURE™ 819 of Ciba® in 10 mL of butylacetate. The formulation was spin-coated onto clean ITO substrates for 30 s at 6000 rpm (acceleration 20) to give films of thickness in the range of about 500 nm. ITO glass slides were cleaned by sonication in organic solvents before use. After the spin-coating step, the resulting dielectric films were irradiated using ultraviolet light. The UV wavelength was 365 nm. The curing dose was 2000 mJ/cm² (example I.3.a)). Intensity and dose were measured using a radiometer.

b) Dielectric formulation was prepared by dissolving 1 g of a styrene-butadiene-styrene block copolymer (ca. Mw 70,000 styrene, Mw 30,000 butadiene, Mw 35,000 styrene) and 80 mg of the initiator IRGACURE™ 819 of Ciba® in 20 mL of a mixture of cyclohexane/toluene (1/6). The formulation was spin-coated onto clean ITO substrates for 30 s at 4800 rpm (acceleration 20) to give films of thickness in the range of about 500 nm. ITO glass slides were cleaned by sonication in organic solvents before use. After the spin-coating step, the resulting dielectric films were irradiated using ultraviolet light. The UV wavelength was 365 nm. The curing dose was 4000 mJ/cm² (example I.3.b)). Intensity and dose were measured using a radiometer.

Figure 3:
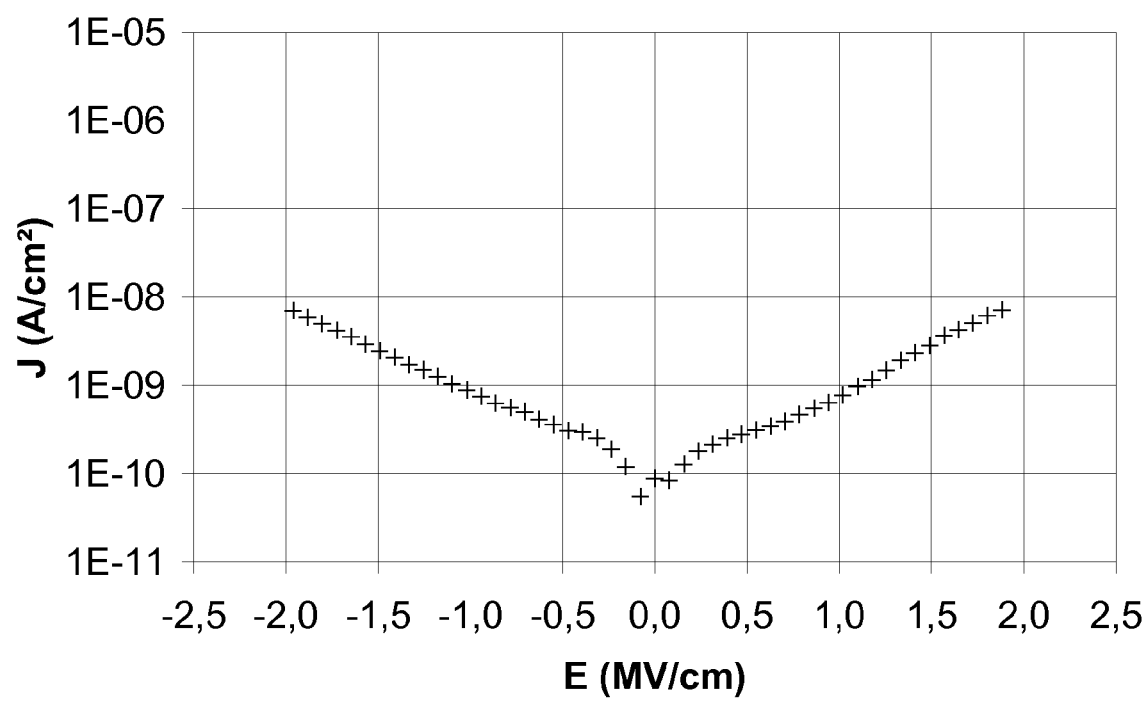
FIG. 3 shows leakage current density J versus electric field E for the dielectric film of example I.3.a).

In FIG. 3 the leakage current density (current density J [A/cm²] in relation to the electric field E [MV/cm] for the dielectric films of example I.3.a) is shown.

The curve of the plus (+) in FIG. 3 shows the leakage current density of a dielectric film according to example I.3.a) (statistic S/B copolymer, 500 nm, 2000 mJ/cm²).

Figure 4:
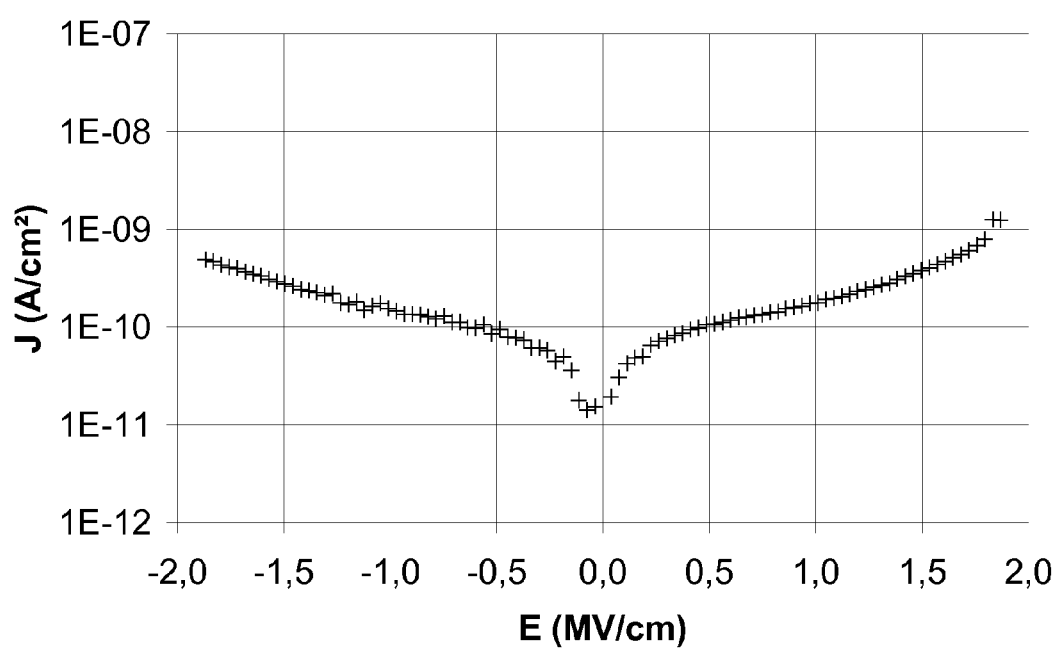
FIG. 4 shows leakage current density J versus electric field E for the dielectric film of example I.3.b).

In FIG. 4 the leakage current density (current density J [A/cm²] in relation to the electric field E [MV/cm] for the dielectric films of example I.3.b) is shown.

The curve of the plus (+) in FIG. 4 shows the leakage current density of a dielectric film according to example I.3.b) (statistic S/B/S block copolymer, 500 nm, 4000 mJ/cm²).

I.4 Capacitor Fabrication with Self Incorporating Initiator

The Capacitor fabrication with a triacrylate as dielectric has been carried out according to example I.1.b.i) (TMPTA, 10% PMMA in Butylacetat, 500 nm, 2000 mJ/cm²) using initiator A (4 wt. %) instead of IRGACURE™ 500 of Ciba®.

Initiator A:

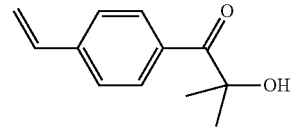

Figure 5:
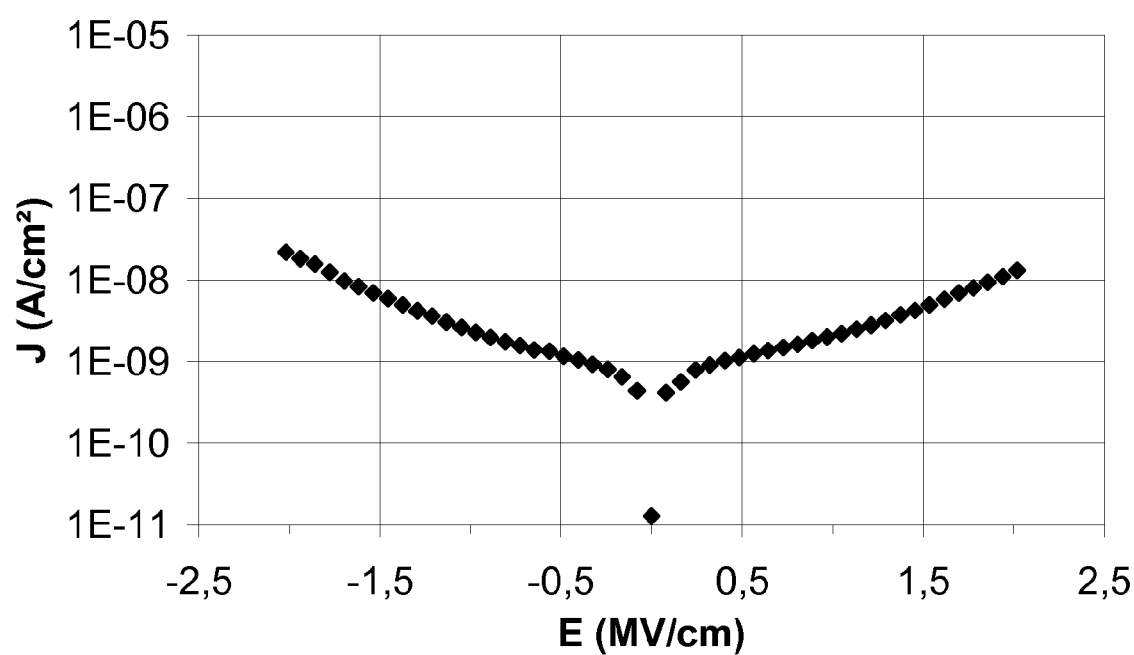
FIG. 5 shows leakage current density J versus electric field E for the dielectric film of example I.4.

In FIG. 5 the leakage current density (current density J [A/cm²] in relation to the electric field E [MV/cm] for the dielectric films of examples I.1.a.i), I.1.a.ii), I.1.b.i) and I.1.b.ii) is shown.

The curve of the black rhombus in FIG. 1 shows the leakage current density of a dielectric film according to example 1.4 (TMPTA, 500 nm, cured at 256 nm).

II Dielectric Characterization

Device Preparation

In a typical setup conductor-insulator-conductor capacitor structures were fabricated using the resulting dielectric films described above. Top Au electrodes (area=0.785 mm²) were then vacuum-deposited through a shadow mask on top of the polymer insulator at <1×10⁻⁶ Torr to complete the capacitor structure.

Testing System

The IN curves were measured with an Agilent 4155C parameter analyzer in the range +100 ... −100V. The capacitance was measured with the LCR meter Agilent 4284A in the frequency range 20 Hz-100 kHz with an ac voltage of 1V. To switch between both instruments a switch matrix Agilent E5250A was used. The prober station used was a Blue Ray system from Suess, including the prober itself, the controller unit and the heating unit. The control of the prober is done via a control PC. The control of all instruments including the prober is done with a second PC with the I/CV software package from Metrix.

Measurement Procedure

The measurements at each measuring point were done in the following sequence.

1) Resistance at 1V: From I/V data at 1V.
2) Capacitance, loss factor: The capacitance and the dielectric loss factor tanδ were measured for the following frequencies: 20 Hz, 100 Hz, 1 kHz, 10 kHz, 100 kHz. From these data, the dielectric parameters ∈' and ∈" can be calculated (eq. 1 and 2).

3) I/V curves: The IN curves for positive voltages were measured from 0 to +100V in 2V steps on one half of the electrodes. The I/V curves for negative voltages were measured from 0 to −100V in −2V steps on the other half of the electrodes. The Source electrode was connected with the ITO electrode and the Gate electrode with the potential with the gold contact on top.

From the measured resistance R, the volume resistivity p can be calculated by:

$$\rho = RA/d$$

The breakdown voltage Ud can be determined from the I/V curve: It is the voltage, where the current reaches a value of 1 µA for the first time. The breakdown strength Ed can be calculated by:

$$Ed = Ud/d$$

The dielectrics described in this patent show excellent properties in terms of both processing and film formation as well as regarding the electronic characteristics. As can be seen in the I/E curves, the leakage currents are very low, especially in the most relevant range between −0.5 MV/cm and +0.5 MV/cm.

III Triacrylates and Hexacrylates as Dielectrics

1 Capacitor Fabrication (Triacrylates)

The Capacitor fabrication with a triacrylate as dielectric has been carried out according to example I.1.b.i).

2 Capacitor Fabrication (Hexaacrylates)

Dielectric formulation was prepared by dissolving 2 g of capa-dipentahexaacrylate (CDPHA), 200 mg of PMMA (Mw=996,000) and 80 mg of the initiator IRGACURE™ 500 of Ciba® in 11.5 mL of cyclohexanone. The formulation was spin-coated onto clean ITO substrates for 30 s at 6000 rpm (acceleration 20) to give films of thickness in the range of about 500 nm. ITO glass slides were cleaned by sonication in organic solvents before use. After the spin-coating step, the resulting dielectric films were irradiated using ultraviolet light. The UV wavelength was 256 nm, the curing dose 2000 mJ/cm². Intensity and dose were measured using a radiometer. The films were dried in a vacuum oven at 100° C. for 10 minutes to completely remove any residual solvent.

Figure 6:
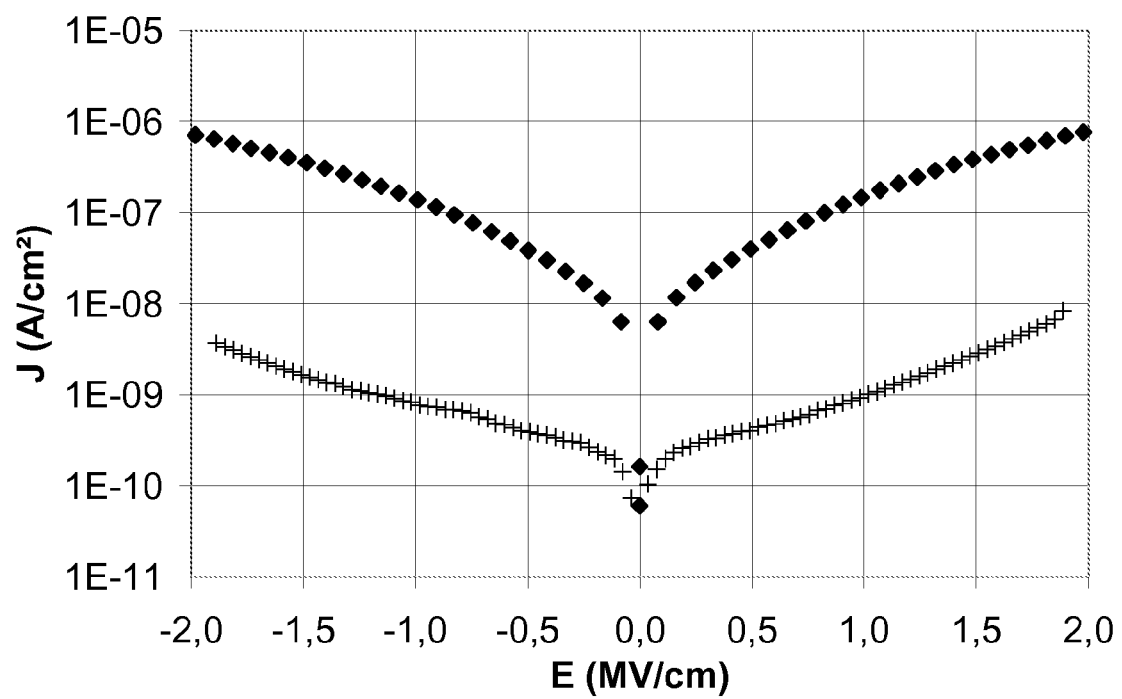
FIG. 6 shows leakage current density J versus electric field E for the dielectric films of examples III.1 and III.2.

In FIG. 6 the leakage current density (current density J [A/cm²] in relation to the electric field E [MV/cm] for the dielectric films of examples III.1 and III.2 is shown.

The curve of the black rhombus in FIG. 6 shows the leakage current density of a dielectric film according to example III.2 (CDPHA, 500 nm, cured at 256 nm).

The curve of the plus (+) in FIG. 6 shows the leakage current density of a dielectric film according to example III.1 (TMPTA, 500 nm, cured at 256 nm).

The dielectric films can be patterned by doing the UV crosslinking through a shadow mask. The comparison of structured TMPTA with capa-dipentahexaacrylate cured under the same conditions shows that the TMPTA formulation described in this patent can be patterned in a more defined way with nice edges and very uniform structures than CDPHA.

IV Characterization in a Field Effect Transistor

In order to manufacture field effect transistors, gold was evaporated through a shadow mask on a glass slide as a gate electrode. A TMPTA formulation (2 g of a triacrylate, 200 mg PMMA and 80 mg of initiator IRGACURE™ 500 of Ciba® in 10 mL of butylacetate was spincoated on top and UV cured as described earlier. Source/drain electrodes of gold (thickness approximately 40 nm) were evaporated through a shadow mask on top of the crosslinked dielectric layer. The semiconductor films (Poly(thieno[2,3-b]thiophene-co-4,4-dialkyl 2,2-bithiophene, see Heeney, McCulloch, J. Am. Chem. Soc., 2005, 127, 1078-1079) were applied by spin coating (2000 rpm, 255 acc, 60 s) of a hot solution of 5 mg/mL in chlorobenzene. The film was not annealed before measuring the transistor characteristics. All procedures were performed without a protective atmosphere. The FET characteristics were measured at ambient with a Keithley 4200 semiconductor parameter analyzer.

Figure 7:
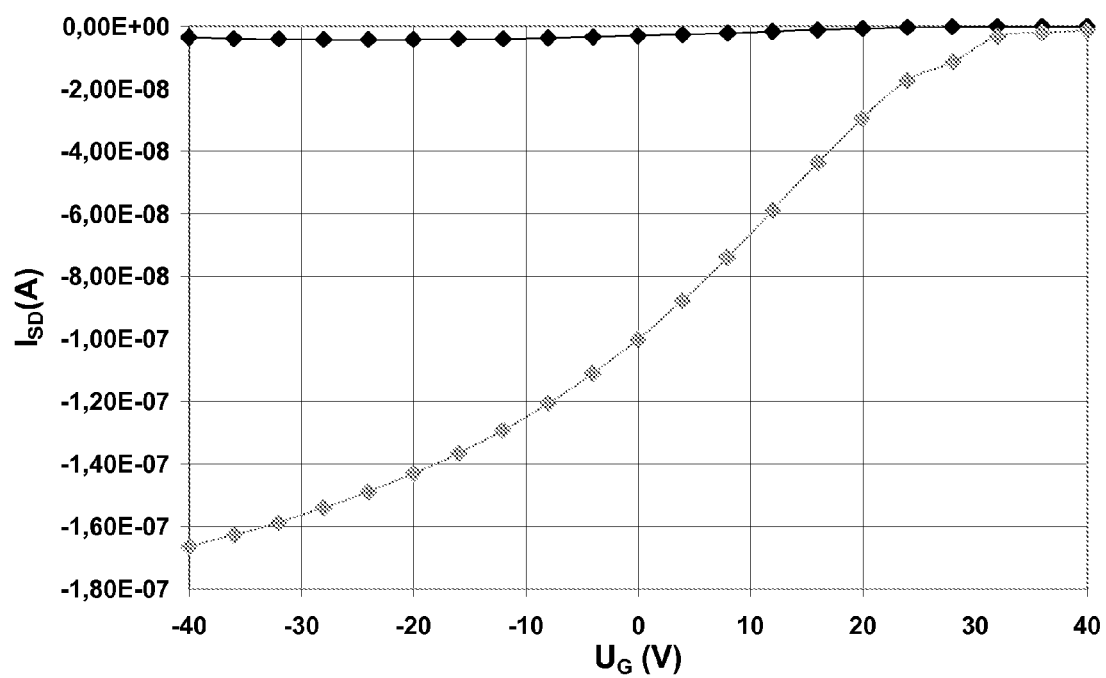
FIG. 7 shows transfer curves for a TMPTA/Poly(thieno[2,3-b]thiophene-co-4,4-dialkyl 2,2-bithiophene transistor in a bottom gate bottom contact architecture at −1 V and −30V source-drain voltage.

FIG. 7 shows transfer curves for a TMPTA/Poly(thieno[2,3-b]thiophene-co-4,4-dialkyl 2,2-bithiophene transistor in a bottom gate bottom contact architecture at −1V and −30V source-drain voltage.

| Grey rhombus | transfer curve at $U_{SD} = -1$ V |
| Black rhombus | transfer curve at $U_{SD} = -30$ V |
| $U_g$ [V] | gate voltage |
| $I_{SD}$ [A] | source drain current |

The observed mobility of 4.40E-02 cm²/Vs (calculated for the saturation regime) is typical for a non-annealed FET prepared with this semiconductor in combination with a good dielectric. Ion/Ioff (min/max)=112. The gate leakage is at $U_{SD}=30$V is about 3 orders of magnitudes below the source drain current $I_{SD}$.

Figure 8:
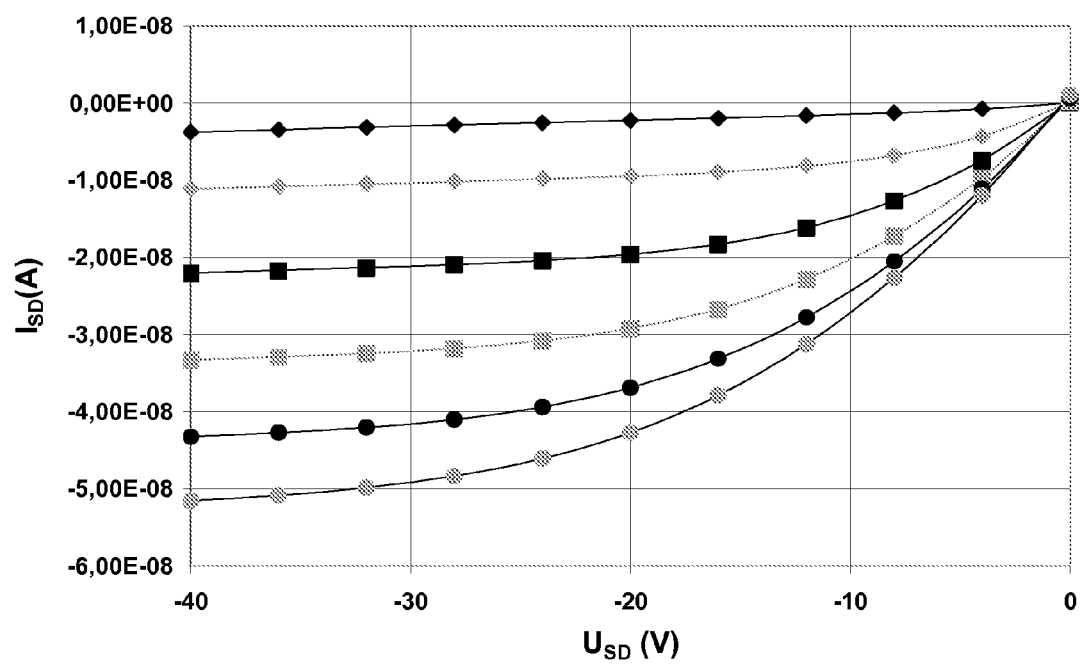
FIG. 8 shows output curves at 5V, 0V, −5V, −10V, −15V, −20V gate voltage (from top to bottom) for a TMPTA/Poly(thieno[2,3-b]thiophene-co-4,4-dialkyl 2,2-bithiophene transistor in a bottom gate bottom contact architecture at −5V, 0V, −5V, −10V, −15V, −20V gate voltage.

FIG. 8 shows output curves at 5V, 0V, −5V, −10V, −15V, −20V gate voltage (from top to bottom) for a TMPTA/Poly(thieno[2,3-b]thiophene-co-4,4-dialkyl 2,2-bithiophene transistor in a bottom gate bottom contact architecture at −5V, 0V, −5V, −10V, −15V, −20V gate voltage.

| Black rhombus | output curve at $U_G = 5$ V |
| Grey rhombus | output curve at $U_G = 0$ V |
| Black square | output curve at $U_G = -5$ V |
| Grey square | output curve at $U_G = -10$ V |
| Black dot | output curve at $U_G = -15$ V |
| Grey dot | output curve at $U_G = -20$ V |

V Characterization in a Field Effect Transistor

V.1 Characterization in a Field Effect Transistor: Vialkyd AM 342

In order to manufacture field effect transistors, ITO glass was used as substrate with unstructured gate electrode. A 2 mm wide stripe of the ITO substrate was covered with scotch tape before spincoating the dielectric formulation on top. A mixture of Vialkyd® AM 342 formulation (1.8 g formulation and 80 mg of initiator IRGACURE™ 500 of Ciba® in 10 mL of butylacetate, filtered through a 1 µm PTFE filter, see I.2a) was spincoated on the ITO glass and UV cured as described earlier. The semiconductor films (Sepiolid™ P1000 from BASF SE®) were applied by spin coating (1500 rpm, 10.000 rpm/s, 30 s) a solution of 10 mg/mL in toluene (filtered through a 0.45 1 µm PTFE filter. The film was dried at 90° C. for 30 s on a hot plate. The scotch tape was removed before source/drain electrodes of gold (thickness approximately 40 nm) were evaporated through a shadow mask on top of the semiconductor layer to form a bottom gate top contact transistor. All procedures were performed in a clean room in ambient. The FET characteristics were measured in ambient with a Keithley 4200 semiconductor parameter analyzer.

The observed mobility of 8E-02 to 9E-02 cm²/Vs is typical for a FET prepared with this semiconductor in combination with a good dielectric.

The gate leakage at $U_{SD}=-20V$ is about 2 orders of magnitudes below the source drain current $I_{SD}$.

V.2 Characterization in a Field Effect Transistor: Poly[Vinyl (Methacrylic Benzene)] (PVMB)

In order to manufacture field effect transistors, ITO glass was used as substrate with unstructured gate electrode. A 2 mm wide stripe of the ITO substrate was covered with scotch tape before spincoating the dielectric formulation on top. A mixture of 300 mg poly[vinyl(methacrylic benzene)] (PVMB) (derived from poly(4-vinylphenol), Aldrich: typical $M_w$=20000 g/mol, CAS: 24979-70-2, by polymer analogous reaction) and 12 mg of IRGACURE™ 500 of Ciba® in 2 mL of butylacetate, filtered through a 5 μm PTFE filter) was spincoated on the ITO glass and UV cured at 256 nm wavelength (typically: 3500 rpm, 10000 rpm/s, 30 s; 2000 mJ/cm²). The semiconductor films (Sepiolid™ P1000 from BASF SE®) were applied by spin coating (1500 rpm, 10.000 rpm/s, 30 s) a solution of 10 mg/mL in toluene (filtered through a 0.45 1 μm PTFE filter. The film was dried at 90° C. for 30 s on a hot plate. The scotch tape was removed before source/drain electrodes of gold (thickness approximately 40 nm) were evaporated through a shadow mask on top of the semiconductor layer to form a bottom gate top contact transistor. All procedures were performed in a clean room in ambient. The FET characteristics were measured in ambient with a Keithley 4200 semiconductor parameter analyzer.

The observed mobility of ~5E-02 cm²/Vs is typical for a FET prepared with this semi-conductor in combination with a good dielectric. The gate leakage at $U_{SD}=-20V$ is about 2 orders of magnitudes below the source drain current $I_{SD}$.

poly[vinyl(methacrylic benzene)] (PVMB):

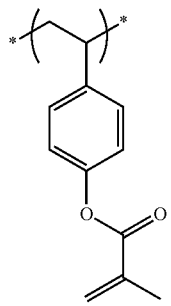

V.3 Characterization in a Field Effect Transistor: Random Poly[Vinyl(Methacrylic Benzene)-co-Acetoxy Styrene] (PVMB-co-As)

In order to manufacture field effect transistors, ITO glass was used as substrate with unstructured gate electrode. A 2 mm wide stripe of the ITO substrate was covered with scotch tape before spincoating the dielectric formulation on top. A mixture of 300 mg of random poly[vinyl(methacrylic benzene)-co-acetoxy styrene] (PVMB-co-AS, typical ration of 17/83 VMB/AS) (derived from poly(4-vinylphenol), Aldrich: typical $M_w$=20000 g/mol, CAS: 24979-70-2, by polymer analogous reaction) and 12 mg of IRGACURE™ 500 of Ciba® in 2 mL of butylacetate, filtered through a 1 μm PTFE filter) was spin-coated on the ITO glass and UV cured at 256 nm wavelength (typically: 3500 rpm, 10000 rpm/s, 30 s; 2000 mJ/cm²). The semiconductor films (Sepiolid™ P1000 from BASF SE®) were applied by spin coating (1500 rpm, 10.000 rpm/s, 30 s) a solution of 10 mg/mL in toluene (filtered through a 0.45 1 μm PTFE filter. The film was dried at 90° C. for 30 s on a hot plate. The scotch tape was removed before source/drain electrodes of gold (thickness approximately 40 nm) were evaporated through a shadow mask on top of the semiconductor layer to form a bottom gate top contact transistor. All procedures were performed in a clean room in ambient. The FET characteristics were measured in ambient with a Keithley 4200 semiconductor parameter analyzer.

The observed mobility of ~5E-02 cm²/Vs is typical for a FET prepared with this semi-conductor in combination with a good dielectric. The gate leakage at $U_{SD}=-20V$ is about 2 orders of magnitudes below the source drain current $I_{SD}$.

poly[vinyl(methacrylic benzene)-co-acetoxy styrene] (PVMB-co-AS):

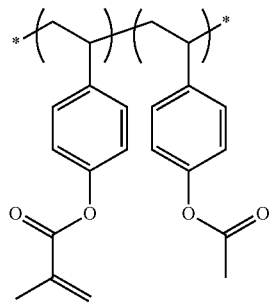

V.4 Characterization in a Field Effect Transistor: Random Poly[Vinyl(Methacrylic Benzene)-co-Acetoxy Styrene] (PVMB-co-AS)+PMMA In order to manufacture field effect transistors, ITO glass was used as substrate with unstructured gate electrode. A 2 mm wide stripe of the ITO substrate was covered with scotch tape before spincoating the dielectric formulation on top. A mixture of 300 mg random poly[vinyl(methacrylic benzene)-co-acetoxy styrene] (PVMB-co-AS, typical ration of 17/83 VMB/AS) (derived from poly(4-vinylphenol), Aldrich: typical $M_w$=20000 g/mol, CAS: 24979-70-2, by polymer analogous reaction) 300 mg of PMMA (typical $M_w$=996000 g/mol) and 12 mg of IRGACURE™ 500 of Ciba® in 2 mL of butylacetate, filtered through a 1 μm PTFE filter) was spincoated on the ITO glass and UV cured at 256 nm wavelength (typically: 3500 rpm, 10000 rpm/s, 30 s; 2000 mJ/cm²). The semiconductor films (Sepiolid™ P1000 from BASF SE®) were applied by spin coating (1500 rpm, 10.000 rpm/s, 30 s) a solution of 10 mg/mL in toluene (filtered through a 0.45 1 μm PTFE filter. The film was dried at 90° C. for 30 s on a hot plate. The scotch tape was removed before source/drain electrodes of gold (thickness approximately 40 nm) were evaporated through a shadow mask on top of the semiconductor layer to form a bottom gate top contact transistor. All procedures were performed in a clean room in ambient. The FET characteristics were measured in ambient with a Keithley 4200 semiconductor parameter analyzer.

The observed mobility of ~4E-02 cm²/Vs is typical for a FET prepared with this semi-conductor in combination with a good dielectric. The gate leakage at $U_{SD}=-20V$ is about 2 orders of magnitudes below the source drain current $I_{SD}$.

poly[vinyl(methacrylic benzene)-co-acetoxy styrene] (PVMB-co-AS):

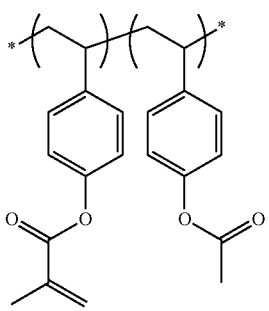

V.5 Characterization in a Field Effect Transistor: Poly[4-Vinyl(Methacrylic Benzene)-co-Methyl Methacrylate)] (PVMB-co-MMA)

In order to manufacture field effect transistors, ITO glass was used as substrate with unstructured gate electrode. A 2 mm wide stripe of the ITO substrate was covered with scotch tape before spincoating the dielectric formulation on top. A mixture of 300 mg of poly[4-vinyl(methacrylic benzene)-co-methyl methacrylate)] (PVMB-co-MMA, typical ration of 44/56 VMB/MMA) (derived from poly(4-vinylphenol), Aldrich: typical $M_w$=20000 g/mol, CAS: 24979-71-3, by polymer analogous reaction) and 12 mg of IRGACURE™ 500 of Ciba® in 2 mL of butylacetate, filtered through a 1 μm PTFE filter) was spincoated on the ITO glass and UV cured at 256 nm wavelength (typically: 4000 rpm, 10000 rpm/s, 30 s; 2000 mJ/cm$^2$). The semiconductor films (Sepiolid™ P1000 from BASF SE®) were applied by spin coating (1500 rpm, 10.000 rpm/s, 30 s) a solution of 10 mg/mL in toluene (filtered through a 0.45 1 μm PTFE filter. The film was dried at 90° C. for 30 s on a hot plate. The scotch tape was removed before source/drain electrodes of gold (thickness approximately 40 nm) were evaporated through a shadow mask on top of the semiconductor layer to form a bottom gate top contact transistor. All procedures were performed in a clean room in ambient. The FET characteristics were measured in ambient with a Keithley 4200 semiconductor parameter analyzer.

The observed mobility of ~5E-02 cm$^2$/Vs is typical for a FET prepared with this semi-conductor in combination with a good dielectric. The gate leakage at $U_{SD}$=−20V is about 2 orders of magnitudes below the source drain current $I_s$).
poly[4-vinyl(methacrylic benzene)-co-methyl methacrylate)] (PVMB-co-MMA):

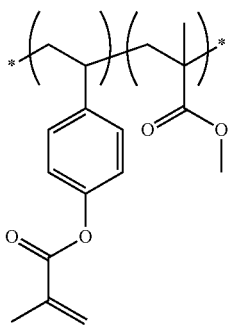

V.6 Characterization in a Field Effect Transistor: Poly[4-Vinyl(Methacrylic Benzene)-co-Methyl Methacrylate)] (PVMB-co-MMA)+PMMA In order to manufacture field effect transistors, ITO glass was used as substrate with unstructured gate electrode. A 2 mm wide stripe of the ITO substrate was covered with scotch tape before spincoating the dielectric formulation on top. A mixture of 300 mg of poly[4-vinyl(methacrylic benzene)-co-methyl methacrylate)] (PVMB-co-MMA, typical ration of 44/56 VMB/MMA) (derived from poly(4-vinylphenol), Aldrich: typical $M_w$=20000 g/mol, CAS: 24979-71-3, by polymer analogous reaction), 300 mg PMMA (typical $M_w$=996000 g/mol) and 12 mg of IRGACURE™ 500 of Ciba® in 2 mL of butylacetate, filtered through a 1 μm PTFE filter) was spincoated on the ITO glass and UV cured at 256 nm wavelength (typically: 3500 rpm, 10000 rpm/s, 30 s; 2000 mJ/cm$^2$). The semiconductor films (Sepiolid™ P1000 from BASF SE®) were applied by spin coating (1500 rpm, 10.000 rpm/s, 30 s) a solution of 10 mg/mL in toluene (filtered through a 0.45 1 μm PTFE filter. The film was dried at 90° C. for 30 s on a hot plate. The scotch tape was removed before source/drain electrodes of gold (thickness approximately 40 nm) were evaporated through a shadow mask on top of the semiconductor layer to form a bottom gate top contact transistor. All procedures were performed in a clean room in ambient. The FET characteristics were measured in ambient with a Keithley 4200 semiconductor parameter analyzer.

The observed mobility of ~7E-02 cm$^2$/Vs is typical for a FET prepared with this semi-conductor in combination with a good dielectric. The gate leakage at $U_{SD}$=−20V is about 2 orders of magnitudes below the source drain current $I_{SD}$.
poly[4-vinyl(methacrylic benzene)-co-methyl methacrylate)] (PVMB-co-MMA):

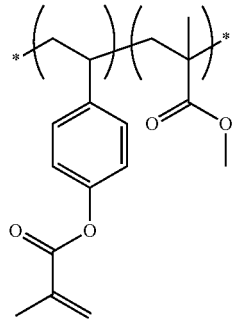

V.7 Characterization in a Field Effect Transistor: Random Styrene-Butadiene-Copolymer In order to manufacture field effect transistors, ITO glass was used as substrate with unstructured gate electrode. A 2 mm wide stripe of the ITO substrate was covered with scotch tape before spincoating the dielectric formulation on top. A mixture of a random styrene-butadiene-copolymer (ca. 26% butadiene, 74% styrene, Mw ~175,000, PDI 2) (1 g polymer and 80 mg of IRGACURE™ 819 of Ciba® in 10 mL of butylacetate, filtered through a 1 μm PTFE filter, see I.3a) was spincoated on the ITO glass and UV cured as described earlier. The semiconductor films (Sepiolid™ P1000 from BASF SE®) were applied by spin coating (1500 rpm, 10.000 rpm/s, 30 s) a solution of 10 mg/mL in toluene (filtered through a 0.45 1 μm PTFE filter. The film was dried at 90° C. for 30 s on a hot plate. The scotch tape was removed before source/drain electrodes of gold (thickness approximately 40 nm) were evaporated through a shadow mask on top of the semiconductor layer to form a bottom gate top contact transistor. All procedures were performed in a clean room in ambient. The FET characteristics were measured in ambient with a Keithley 4200 semiconductor parameter analyzer.

The observed mobility of ~5E-02 cm$^2$/Vs is typical for a FET prepared with this semi-conductor in combination with a good dielectric. The gate leakage at $U_{SD}$=−20V is about 2 orders of magnitudes below the source drain current $I_s$).

V.8 Characterization in a Field Effect Transistor: Uralac® am 352

In order to manufacture field effect transistors, ITO glass was used as substrate with unstructured gate electrode. A 2 mm wide stripe of the ITO substrate was covered with scotch tape before spincoating the dielectric formulation on top. A mixture of Uralac® AM 352 Formulation (1.7 g formulation and 80 mg of initiator IRGACURE™ 500 of Ciba® in 10 mL of butylacetate, filtered through a 1 μm PTFE filter, see 1.2b) was spincoated on the ITO glass and UV cured as described earlier. The semiconductor films (Sepiolid™ P1000 from BASF SE®) were applied by spin coating (1500 rpm, 10.000 rpm/s, 30 s) a solution of 10 mg/mL in toluene (filtered through a 0.45 1 μm PTFE filter. The film was dried at 90° C. for 30 s on a hot plate. The scotch tape was removed before source/drain electrodes of gold (thickness approximately 40 nm) were evaporated through a shadow mask on top of the semiconductor layer to form a bottom gate top contact transistor. All procedures were performed in a clean room in ambient. The FET characteristics were measured in ambient with a Keithley 4200 semiconductor parameter analyzer.

The observed mobility of ~4E-02 cm$^2$/Vs is typical for a FET prepared with this semi-conductor in combination with a good dielectric. The gate leakage at $U_{SD}$=−20V is about 2 orders of magnitudes below the source drain current $I_{SD}$.

V.9 Characterization in a Field Effect Transistor: Triacrylate

In order to manufacture field effect transistors, soda lime glass with photolithographically etched ITO was used as substrate with gate electrode. A TMPTA formulation (2 g of a triacrylate, 200 mg PMMA and 80 mg of IRGACURE™ 500 of Ciba® in 30 mL of a 2:1 mixture of butylacetate and ethyllactate, filtered through a 1 μm PTFE filter) was spincoated on top and UV cured as described earlier A series of 24 films of 115 nm thickness have been obtained, all showing similar characteristics in an FET. Source/drain electrodes of gold (thickness approximately 40 nm) were applied on top of the crosslinked dielectric layer. The semiconductor film (Sepiolid™ P1000 from BASF SE®) was applied by spin coating (500 rpm, 10.000 rpm/s, 2 min) a solution of 5 mg/mL in o-xylene (filtered through a 0.45 μm PTFE filter) to form a bottom gate, bottom contact transistor. All procedures were performed in a clean room in ambient. The FET characteristics were measured in ambient with a Keithley 4200 semiconductor parameter analyzer.

For all transistors prepared by following this procedure, an average mobility of ~3E-03 cm$^2$/Vs has been observed which is typical for a bottom gate bottom contact FET prepared with this semiconductor in combination with a good dielectric. The measured Ion/Ioff (min/max) ratios are typically in the range of Ion/Ioff=10E+05 to 10E+06. The maximum gate leakage observed at $U_{SD}$=−30V is about 90 nA, which is about 4-5 orders of magnitudes below the source drain current $I_{SD}$.

VI Further Acrylic Compounds, Alkyd Resins and Styrene-Butadiene Copolymers as Dielectrics VI.1 Capacitor Fabrication General Description Dielectric Film Preparation Dielectric formulation was prepared by dissolving 1-5 g of the corresponding material or material formulation in 5-20 mL of a suitable solvent (e.g. butyl acetate, cyclohexanone, ethyl actate). After addition of initiator (2-12 weight %, referring to the polymer/resin content), the formulation was spincoated onto clean ITO substrates. Spinspeed and acceleration were chosen in such a way that films of thicknesses in the range of about 500 nm were obtained (usually 2000-5000 rpm, acceleration of about 10,000 rpm/s).

ITO glass slides were cleaned by sonication in organic solvents before use. After the spin-coating step, the resulting dielectric films were cured using irradiation with ultraviolet light (220-380 nm). The curing dose was 2000 mJ/cm$^2$. Intensity and dose were measured using a radiometer.

The leakage current of the dielectric films prepared is shown in the following table.

| Polymer | Film formation/ roughness | Film thickness | Leakage current @ 50 V | Leakage current @ 100 V |
|---|---|---|---|---|
| Laromer ™ LR 8987 + Irgacure 500 | ~50 nm | 530 nm | ~6 × 10$^{-9}$ | ~6 × 10$^{-8}$ |
| Laromer ™ UA 9028 + Irgacure 500 | ~10 nm | 545 nm | ~3 × 10$^{-8}$ | ~9 × 10$^{-8}$ |
| Laromer ™ UA 9033 + Irgacure 500 | ~30 nm | 515 nm | ~5 × 10$^{-7}$ | ~2 × 10$^{-6}$ |
| Laromer ™ UA 9047 + Irgacure 500 | ~45 nm | 490 nm | ~3 × 10$^{-9}$ | ~4 × 10$^{-8}$ |
| Laromer ™ UA 9050 + Irgacure 500 | ~20 nm | 540 nm | ~2 × 10$^{-9}$ | ~1 × 10$^{-8}$ |
| Laromer ™ UA 9028 + Irgacure 819 | ~10 nm | 525 nm | ~9 × 10$^{-9}$ | ~2 × 10$^{-8}$ |
| Laromer ™ UA 9028 + Acrylic-Irgacure 2959* | ~15 nm | 530 nm | ~1 × 10$^{-8}$ | ~8 × 10$^{-8}$ |
| Laromer ™ UA 9028 + Irgacure 2959 | ~15 nm | 530 nm | ~5 × 10$^{-8}$ | ~2 × 10$^{-7}$ |
| Laromer ™ UA 9029 + Acrylic-Irgacure 2959* | ~70 nm | 485 nm | ~3 × 10$^{-9}$ | ~3 × 10$^{-8}$ |
| Laromer ™ UA 9029 + Irgacure 2959 | ~50 nm | 495 nm | ~4 × 10$^{-9}$ | ~4 × 10$^{-8}$ |
| Laromer ™ UA 9047 + Irgacure 819 | ~30 nm | 500 nm | ~2 × 10$^{-9}$ | ~2.5 × 10$^{-8}$ |
| Laromer ™ UA 9047 + Acetylic-Irgacure 2959* | ~30 nm | 510 nm | ~1.5 × 10$^{-9}$ | ~1 × 10$^{-8}$ |
| Laromer ™ UA 9047 + Irgacure 2959 | ~30 nm | 510 nm | ~3 × 10$^{-9}$ | ~3 × 10$^{-8}$ |
| random SBS copolymer + Irgacure 500 | ~10 nm | 500 nm | ~2 × 10$^{-9}$ | ~4 × 10$^{-8}$ |
| SBS triblock copolymer + Irgacure 500 | ~10 nm | 400 nm | ~6 × 10$^{-9}$ | ~6 × 10$^{-9}$ |
| SBS triblock copolymer + Irgacure 369 | ~20 nm | 510 nm | ~6 × 10$^{-9}$ | ~6 × 10$^{-8}$ |
| Alkyd resin Vialkyd ™ AM 342 + Irgacure 500 | ~15 nm | 520 nm | ~3 × 10$^{-9}$ | ~1.5 × 10$^{-8}$ |
| Alkyd resin Uralac ™ AM 352 + Irgacure 500 | ~10 nm | 500 nm | ~3.5 × 10$^{-9}$ | ~4 × 10$^{-9}$ |
| Alkyd resin Banbeam ™ UV-22A + Irgacure 500 | ~35 nm | 510 nm | ~6 × 10$^{-9}$ | ~6 × 10$^{-8}$ |
| Alkyd resin Synthalat ™ HL30 + Irgacure 500 | ~5 nm | 495 nm | ~3 × 10$^{-9}$ | ~5 × 10$^{-8}$ |

-continued

| Polymer | Film formation/ roughness | Film thickness | Leakage current @ 50 V | Leakage current @ 100 V |
|---|---|---|---|---|
| Alkyd resin Synthalat ™ RT35 + Irgacure 500 | ~5 nm | 505 nm | ~8 × 10$^{-9}$ | ~2 × 10$^{-8}$ |
| Alkyd resin Setal ™ 118 XX-60 + Irgacure 500 | ~5 nm | 510 nm | ~2.5 × 10$^{-7}$ | ~1 × 10$^{-6}$ |

Acrylic-Irgacure 2959:

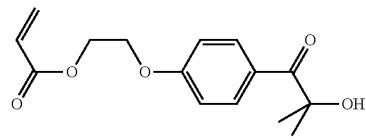

The invention claimed is:

1. An electronic device comprising at least one dielectric layer,
wherein the at least one dielectric layer comprises a crosslinked organic compound based on at least one radically crosslinkable compound,
the at least one radically crosslinkable compound comprises:
(i) at least one acrylate group, wherein the at least one radically crosslinkable compound is selected from the group consisting of a polyether acrylate, a polyester acrylate, and a homopolymer or copolymer acrylate,
(ii) an olefinic double bond, a triple bond, or both in at least one side chain, wherein the at least one radically crosslinkable compound is at least one alkyd resin; or
(iii) both (i) and (ii),
the copolymer acrylate is a random copolymer or a block copolymer of one of formulae

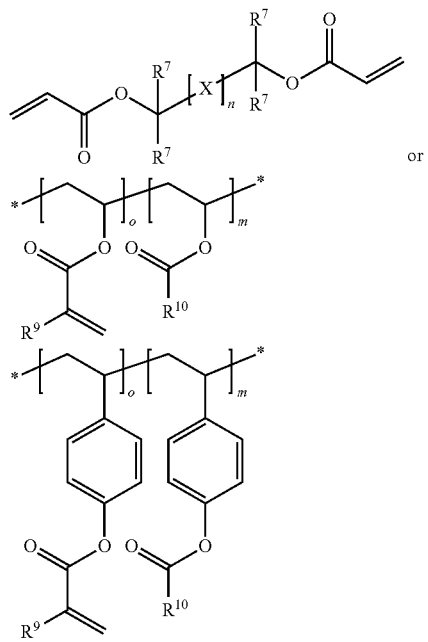

wherein
$R^7$ is independently H; $OR^8$—; alkyl; alkenyl; alkynyl; —C(O)—$OR^8$; —C(O)—$R^8$; —OH; alkyl substituted with —OH, —C(O)—$OR^8$—, or —C(O)—$R^8$—; alkyl wherein the alkyl chain is interrupted by one or more oxygen atoms; aryl; heteroaryl; cycloalkyl; and heterocycloalkyl, X is $CR^8_2$, O, $NR^8$, SiO or $SiR^8_2$,
$R^8$ is H, alkyl, aryl, heteroaryl, cycloalkyl, heterocycloalkyl, vinyl, alkenyl, alkynyl, cycloalkenyl, or cycloalkynyl,
$R^9$ is H or a methyl group,
$R^{10}$ is $C_pH_{2p+1}$, wherein p is from 1 to 6
n is from 1 to 20, and
o+m is from 1 to 500.

2. The electronic device of claim 1, wherein the at least one radically crosslinkable compound comprises at least one alkyd resin of formula

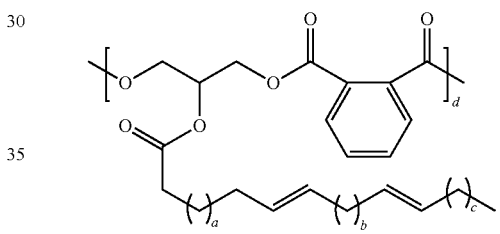

wherein
a and c are independently from 1 to 20,
b is 0 or 1, and
d is from 1 to 1000.

3. The electronic device of claim 1, wherein the crosslinked organic compound is crosslinked by radiation, thermal energy, or both.

4. The electronic device of claim 1, wherein the at least one radically crosslinkable compound is crosslinked in presence of at least one initiator selected from the group consisting of a peroxide, a hydroperoxide, a perester, an azocompound, a sterically hindered ethane derivative, acyloin, a derivative of acyloine, a diketone, a phenone, an organic sulfide, an S-acyl-thiocarbamate, and an initiator comprising a vinyl group, an acrylate group or both.

5. The electronic device of claim 1, wherein the crosslinked organic compound is obtained by reacting a mixture comprising:
at least one radically crosslinkable compound, and
at least one reactive diluent, at least one non-crosslinkable polymer, or both.

6. The electronic device of claim 1, wherein the crosslinked organic compound is obtained by reacting a mixture comprising:
at least one radically crosslinkable compound, and
at least one additive selected from the group consisting of a filler, a diluent, a rheological thickener, a colorant, a surfactant, a film forming agent, and a stabilizer.

7. The electronic device of claim 1, wherein the dielectric layer has a dielectric constant of ≥2.3.

8. The electronic device of claim 1, wherein the electronic device is selected from the group consisting of a thin film transistor, a transistor array, a capacitor, an electroluminescent lamp, and an integrated circuit.

9. The electronic device of claim 1, wherein the electronic device further comprises a semi-conductor layer.

10. The electronic device of claim 8, wherein the device is a thin film transistor having a top-gate configuration.

11. The electronic device of claim 8, wherein the device is a thin film transistor having a bottom-gate configuration.

12. A method of making the electronic device of claim 1, comprising radically crosslinking the at least one radically crosslinkable compound.

13. The electronic device of claim 1, wherein the at least one radically crosslinkable compound is a copolymer acrylate of formula

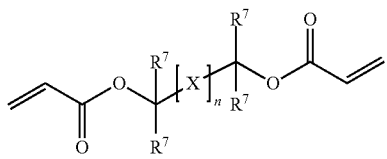

wherein n is from 1 to 10.

14. The electronic device of claim 1, wherein the at least one radically crosslinkable compound is a copolymer acrylate of one of formula

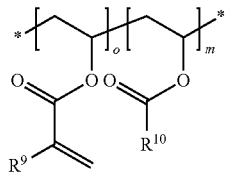

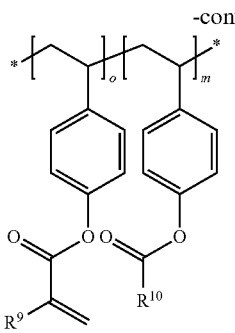

wherein o+m is from 10 to 300.

15. The electronic device of claim 2, wherein the at least one alkyd resin is of formula

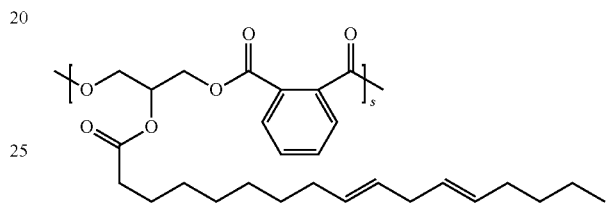

wherein s is from 1 to 1000.

16. The electronic device of claim 2, wherein a and c are independently from 1 to 10.

17. The electronic device of claim 2, wherein d is from 10 to 900.

18. The electronic device of claim 7, wherein the dielectric layer has a dielectric constant of from 2.5 to 10.

* * * * *